United States Patent
Kadono et al.

(10) Patent No.: US 7,664,182 B2
(45) Date of Patent: Feb. 16, 2010

(54) PICTURE CODING AND DECODING APPARATUSES AND METHODS PERFORMING VARIABLE LENGTH CODING AND DECODING ON A SLICE HEADER STREAM AND ARITHMETIC CODING AND DECODING ON A SLICE DATA STREAM

(75) Inventors: Shinya Kadono, Nishinomiya (JP); Makoto Hagai, Moriguchi (JP)

(73) Assignee: Panasonic Corporation, Osaka (JP)

( * ) Notice: Subject to any disclaimer, the term of this patent is extended or adjusted under 35 U.S.C. 154(b) by 700 days.

(21) Appl. No.: 10/415,329

(22) PCT Filed: Aug. 13, 2002

(86) PCT No.: PCT/JP02/08240
§ 371 (c)(1),
(2), (4) Date: Apr. 29, 2003

(87) PCT Pub. No.: WO03/021964
PCT Pub. Date: Mar. 13, 2003

(65) Prior Publication Data
US 2004/0081241 A1    Apr. 29, 2004

(30) Foreign Application Priority Data
Aug. 31, 2001    (JP)    ............................. 2001-263248

(51) Int. Cl.
*H04N 7/12*    (2006.01)
(52) U.S. Cl. ................................. 375/240.23
(58) Field of Classification Search ............ 375/240.01, 375/240.13, 240.23, 240.26; 382/243; H04N 7/12
See application file for complete search history.

(56) References Cited

U.S. PATENT DOCUMENTS
5,168,356 A    12/1992    Acampora et al.

(Continued)

FOREIGN PATENT DOCUMENTS
EP    0 469 835    2/1992

(Continued)

OTHER PUBLICATIONS

Kuroki Nobutaka, et al., "*Lossless Image Compression by Two-Dimensional Linear Prediction With Variable Coefficients*", IEICE Transactions on Fundamentals of Electronics, Communications and Computer Sciences, Engineering Sciences Society, Tokyo, Japan, vol. E75-A, No. 7, Jul. 1, 1992, pp. 882-889, XP000311782.

(Continued)

*Primary Examiner*—Young Lee
(74) *Attorney, Agent, or Firm*—Wenderoth, Lind & Ponack, L.L.P.

(57) ABSTRACT

A frame coding unit generates individual picture signal information from a moving picture signal, and outputs a frame code value which is a numeric value to be obtained as a result of coding picture signal information of each frame. A variable length coding unit decomposes the frame code value into unit frame code values which are basic units of coding, converts the unit frame code values into frame code words using only a single code table, and constructs a frame stream by combining the converted frame code words. A multiplexing unit multiplexes a header stream which is constructed through a method equivalent to a conventional method and the frame stream, and constructs a picture coded signal.

1 Claim, 19 Drawing Sheets

U.S. PATENT DOCUMENTS

| | | |
|---|---|---|
| 5,376,969 A | 12/1994 | Zdepski |
| 5,400,075 A | 3/1995 | Savatier |
| 5,402,244 A | 3/1995 | Kim |
| 5,559,557 A | 9/1996 | Kato |
| 5,748,789 A * | 5/1998 | Lee et al. .................. 382/243 |
| 5,852,669 A | 12/1998 | Eleftheriadis et al. |
| 6,020,923 A | 2/2000 | Hosaka et al. |
| 6,249,546 B1 | 6/2001 | Bist |
| 6,493,385 B1 | 12/2002 | Sekiguchi et al. |
| 6,574,368 B1 | 6/2003 | Boon et al. |

FOREIGN PATENT DOCUMENTS

| | | |
|---|---|---|
| EP | 0 501 699 | 9/1992 |
| EP | 0 720 379 | 7/1996 |
| JP | 05-207286 | 8/1993 |
| JP | 5-207286 | 8/1993 |
| JP | 06-165155 | 6/1994 |
| JP | 6-165155 | 6/1994 |
| JP | 9-35069 | 2/1997 |
| JP | 10-145789 | 5/1998 |
| JP | 10-261966 | 9/1998 |
| JP | 2000-32467 | 1/2000 |
| JP | 2000-236553 | 8/2000 |
| JP | 2000-358243 | 12/2000 |
| JP | 2001-218208 | 8/2001 |
| WO | 99/22525 | 5/1999 |
| WO | 00/01155 | 1/2000 |

OTHER PUBLICATIONS

J. He, et al., "*On the Application of Turbo Codes to the Robust Transmission of Compressed Images*", Image Proceedings, 1997, Proceedings., International Conference on Santa Barbara, CA, USA Oct. 26-29, 1997, Los Alamitos, CA, USA, IEEE, Comput. Soc., US, Oct. 26, 1997, pp. 559-562, XP010253749.

* cited by examiner

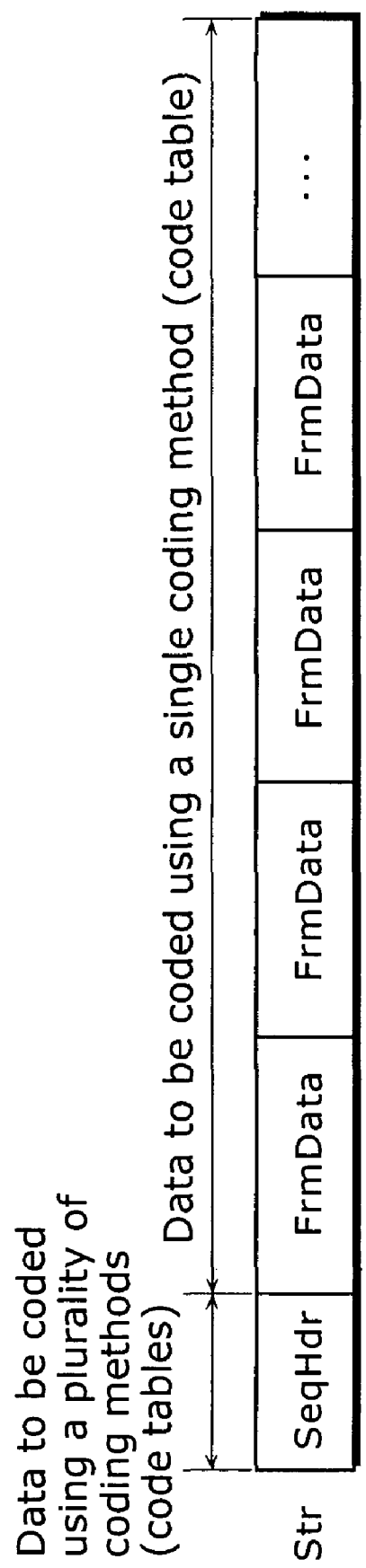

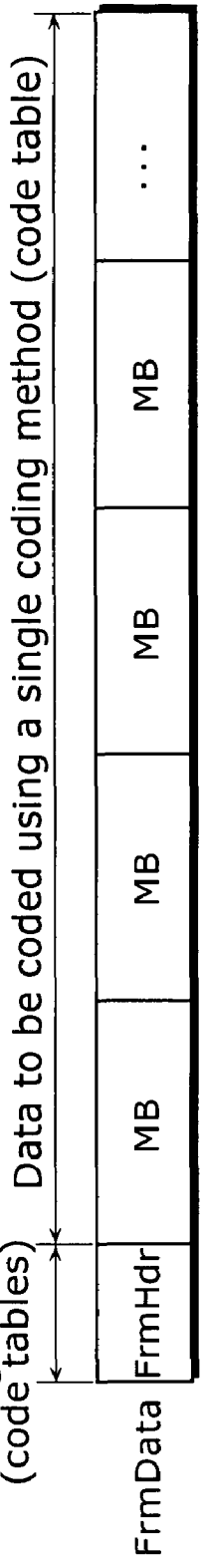
Fig.6A
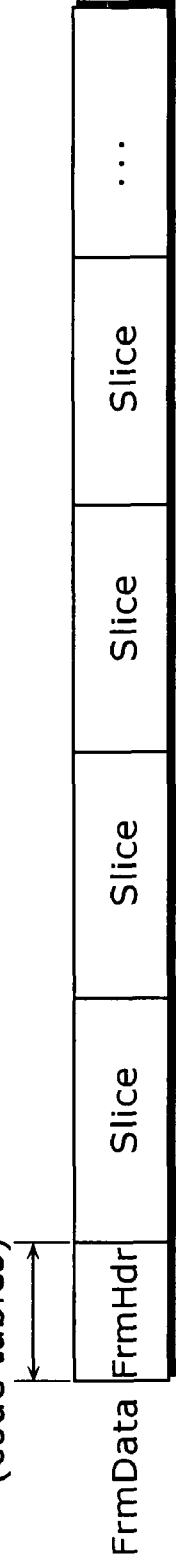
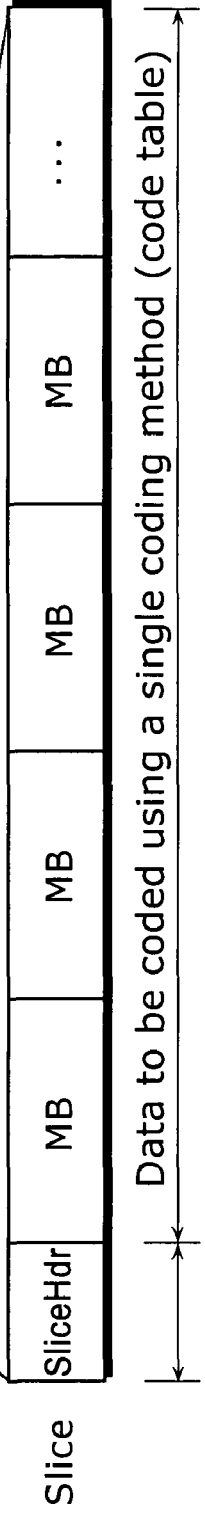
Fig.6B

Fig.7A

| Data | Code word |
|---|---|
| 0 | 1 |
| 1 | 010 |
| 2 | 011 |
| 3 | 00100 |
| 4 | 00101 |
| 5 | 00110 |
| 6 | 00111 |

Fig.7B

| Data | Code word when maximum number of frames is equal to 8 | Code word when maximum number of frames is equal to 16 | Code word when maximum number of frames is equal to 32 |
|---|---|---|---|
| 0 | 000 | 0000 | 00000 |
| 1 | 001 | 0001 | 00001 |
| 2 | 010 | 0010 | 00010 |
| 3 | 011 | 0011 | 00011 |
| 4 | 100 | 0100 | 00100 |
| 5 | 101 | 0101 | 00101 |
| 6 | 110 | 0110 | 00110 |

Fig.14A

| Method<br>Information | Method 1 | Method 2 | Method 3 |
|---|---|---|---|
| Header information | Code table coding | Arithmetic coding | Code table coding |
| Frame information | Arithmetic coding | Arithmetic coding | Code table coding |

Fig.14B

| Method<br>Information | Method 3-1 | Method 3-2 | Method 3-3 | Method 3-4 |
|---|---|---|---|---|
| Header information | Single | Plural | Plural | Single |
| Frame information | Single | Single | Plural | Plural |

PICTURE CODING AND DECODING APPARATUSES AND METHODS PERFORMING VARIABLE LENGTH CODING AND DECODING ON A SLICE HEADER STREAM AND ARITHMETIC CODING AND DECODING ON A SLICE DATA STREAM

TECHNICAL FIELD

The present invention relates to a picture coding method and a picture decoding method, and particularly to a coding technique, a decoding technique and apparatuses thereof concerning data compression intended for recording/transmitting picture signals in an efficient manner.

BACKGROUND ART

In the age of multimedia which integrally addresses audio, video and other contents, existing information media, i.e., newspaper, magazine, television, radio, telephone and other means through which information is conveyed to people, have recently come to be included in the scope of multimedia. Generally, multimedia refers to something that is represented by associating not only characters, but also graphics, voices, and especially pictures and the like together, but in order to include the aforementioned existing information media in the scope of multimedia, it appears as a prerequisite to represent such information in digital form.

However, when calculating the amount of information contained in each of the aforementioned information media as the amount of digital information, while the amount of information per character is 1~2 bytes in the case of characters, the amount of information to be required is 64 Kbits or over per second in the case of voices (telephone quality), and 100 Mbits or over per second in the case of moving pictures (current television reception quality), and it is not realistic for the aforementioned information media to handle such an enormous amount of information as it is in digital form. For example, although video phones are already in the actual use by using Integrated Services Digital Network (ISDN) which offers a transmission speed of 64 Kbps~1.5 Mbps, it is not practical to transmit videos of televisions and cameras directly through ISDN.

Against this backdrop, information compression techniques have become required, and moving picture compression techniques compliant with H.261 and H.263 standards recommended by ITU-T (International Telecommunication Union-Telecommunication Standardization Sector) are employed for video phones, for example. Moreover, according to information compression techniques compliant with the MPEG-1 standard, it is possible to store picture information in an ordinary music CD (compact disc) together with sound information.

Here, MPEG (Moving Picture Experts Group) is an international standard on digital compression of moving picture signals, and MPEG-1 is a standard for compressing television signal information approximately into one hundredth so that moving picture signals can be transmitted at a rate of 1.5 Mbps. Furthermore, since transmission speed within the scope of the MPEG-1 standard is limited primarily to about 1.5 Mbps, MPEG-2, which was standardized with a view to satisfy requirements for further improved picture quality, allows data transmission equivalent in quality to television broadcasting through which moving picture signals are transmitted at a rate of 2~15 Mbps.

Furthermore, MPEG-4 which provides a higher compression ratio has been standardized by the working group (ISO/IEC JTC1/SC29/WG11) which was engaged in the standardization of MPEG-1 and MPEG-2. Not only is it possible to perform a highly efficient coding at a low bit rate, MPEG-4 employs a powerful technique for error resilience which lessens the degradation of picture quality to be judged from a subjective standpoint, even when a transmission channel error occurs.

Meanwhile, in existing picture coding such as H.263 and MPEG-4, a variety of signal conversion/compression processing are performed for a picture signal so as to covert such picture signal into various kinds of values, and then either fixed length coding or variable length coding is performed in accordance with code tables which are appropriately selected according to the meaning of each converted value. Generally, when coding is performed, a compression ratio is increased by allocating a code word of a short code length to a code occurring with a high frequency, and by allocating a code word of a long code length to a code occurring with a low frequency. Since values converted through signal conversion/compression processing are different in their occurrence frequency depending on the meanings such values indicate, a compression ratio of picture coding is increased by making an appropriate selection of code tables which describe code words corresponding to such values. In conventional picture decoding performed in a pair with conventional picture coding, a proper decoding is performed by using the same code tables as used in picture coding.

FIG. 1 is a functional block diagram showing units relating to coding functionality of an existing picture coding apparatus 500. As illustrated in FIG. 1, the picture coding apparatus 500 is comprised of a header/frame coding unit 501, a syntax analyzing unit 502, a fixed length/variable length coding unit 503, and a code table selecting unit 504.

The header/frame coding unit 501 acquires a moving picture signal Vin, and generates header information which is information common to an entire picture and moving picture signal information of each frame on the basis of such moving picture signal Vin.

More specifically, the header/frame coding unit 501 generates, as the header information, a header parameter (inf_H, not illustrated in the diagram) which is information common to the header, a header code value (InfVal_H) which is the header parameter converted into a value, and a header syntax structure signal (Stx_H) indicating the value meaning of the header code value, outputs such header syntax structure signal (Stx_H) to the syntax analyzing unit 502, and outputs the header code value (InfVal_H) to the fixed length/variable length coding unit 503. Moreover, the header/frame coding unit 501 generates, as picture signal information of each frame, a frame code value (InfVal_F) which is a value to be obtained as a result of coding the picture signal of each frame, and a frame syntax structure signal (Stx_F) indicating the value meaning of the frame code value, outputs such frame syntax structure signal (Stx_F) to the syntax analyzing unit 502, and outputs the frame code value (InfVal_F) to the fixed length/variable length coding unit 503. Note that in FIG. 1, the header code value (InfVal_H) and the frame code value (InfVal_F) are collectively described as "InfVal_X", and the header syntax structure signal (Stx_H) and the frame syntax structure signal (Stx_F) are collectively described as "Stx_X".

The syntax analyzing unit 502 generates a code table selection signal (Sel_H or Sel_F) on the basis of either the header syntax structure signal (Stx_H) or the frame syntax structure signal (Stx_F), and outputs it to the code table selecting unit 504. In other words, the syntax analyzing unit 502 generates a code table selection signal (e.g. Sel_H1~Sel_H3, or Sel_F1~Sel_F3) for selecting an appropriate code table from a plurality of code tables on the basis of a value indicated by a header syntax structure signal or a frame syntax structure signal. Note that in FIG. 1, the code table selection signals (Sel_H and Sel_F) are described collectively as "Sel_X".

The fixed length/variable length coding unit 503 constructs a picture coded signal (Str) on the basis of the header code value (InfVal_H) and the frame code value (InfVal_F). To be more specific, the header code value (InfVal_H) is decomposed into unit header code values (Val_H: e.g. Val_H1~Val_H3) which are basic units of coding. Then, code tables are selected by the code table selecting unit 504 based on these unit header code values so as to obtain header code words (Code_H), and a header stream (Str_H) is constructed by combining the header code value (InfVal_H) and the header code words (Code_H) together. Furthermore, the fixed length/variable length coding unit 503 decomposes the frame code value (InfVal_F) into unit frame code values (Val_F: e.g. Val_F1~Val_F3) which are basic units of coding, selects code tables in the code table selecting unit 504 based on these unit frame code values so as to obtain frame code words (Code_F), and constructs a frame stream (Str_F) by combining the frame code value (Infval_F) and the frame code words (Code_F) together. Furthermore, the fixed length/variable length coding unit 503 multiplexes the header stream (Str_H) and the frame stream (Str_F) so as to construct a picture coded signal (Str). Note that in FIG. 1, the unit header code values (Val_H) and the unit frame code values (Val_F) are collectively described as "Val_X", and the header code words (Code_H) and the frame code words (Code_F) are collectively described as "Code_X".

As described above, the code table selecting unit 504 selects code tables on the basis of the code table selection signal Sel_X and the unit header code values or the unit frame code values, generates header code words or frame code words according to such selected code tables, and outputs them to the fixed length/variable length coding unit 503.

FIG. 2 is a diagram showing a stream structure of a conventional picture coded signal. The picture coded signal Str is comprised of frame data FrmData in which picture signal information of each frame making up the picture is stored and a sequence header SeqHdr which is information common to each frame. Pieces of information making up the sequence header SeqHdr are a synchronizing signal SeqSync intended for synchronization between transmission and receiving, a picture size Size of each frame and a frame rate FrmRate. Meanwhile, the frame data FrmData is made up of macroblock data MB specific to macroblocks making up a frame, and a frame header FrmHdr which is data common to each macroblock. The frame header FrmHdr is made up of a synchronizing signal FrmSync intended for synchronization among frames and a frame number FrmNo that indicates a time at which the frame is displayed. Moreover, macroblock data MB is made up of a coding flag Cod indicating whether such macroblock is coded or not, a macroblock coding mode Mode indicating a coding method to be used for each macroblock, and when coding is performed added with motion compensation, motion information MV indicating the amount of such motion, and pixel value data Coef which is coded data of each pixel.

FIG. 3 is a functional block diagram showing units relating to decoding functionality of an existing picture decoding apparatus 600. In this diagram, the same numbers are assigned to configurations that offer the same functions and the signals that have the same meanings as those in the functional diagram for the existing picture coding apparatus 500 illustrated in FIG. 1, and explanations thereof are omitted.

A fixed length/variable length decoding unit 601 splits the picture coded signal Str into the header stream (Str_H) and the frame stream (Str_F). Furthermore, the fixed length/variable length decoding unit 601 decomposes the header stream (Str_H) into header code words Code_H (e.g. Code_H1~Code_H3) which are basic units of decoding so as to obtain, in a code table selecting unit 602, the unit header code values (Val_H) corresponding to the header code words (Code_H), and constructs the header code value (InfVal_H) by combining them. Moreover, the fixed length/variable length decoding unit 601, as in the case of the above header stream (Str_H), decomposes the frame stream (Str_F) into frame code words Code_F (e.g. Code_F1~Code_F3) which are basic units of decoding so as to obtain, in the code table selecting unit 602, the unit frame code values Val_F corresponding to the frame code words Code_F, and constructs the frame code value (InfVal_F) by combining them.

A header/frame decoding unit 603 decodes the header code value (InfVal_H) so as to decompress the header information, and outputs the header parameter (inf_H, not illustrated in the diagram) which is information common to the header and the header syntax structure signal (Stx_H) indicating the characteristic of the following header code value. The header syntax structure signal (Stx_H) here is information indicating the meaning of the next code word which is necessary for decoding such next code word in the header. Furthermore, the header/frame decoding unit 603, as in the case of the above header code value (InfVal_H), decompresses the frame code value InfVal_F of each frame, and outputs the frame syntax structure signal Stx_F and a decoded moving picture signal Vout.

A syntax analyzing unit 604 outputs a code table selection signal (Sel_H) for switching an output of the code table selecting unit 602 according to the header syntax structure signal (Stx_H) in order to decode the next code word in the header. In other words, the syntax analyzing unit 604 generates the code table selection signal (Sel_H) for switching to an appropriate code table of a plurality of code tables according to a value indicated by the header syntax structure signal (Stx_H). Furthermore, the syntax analyzing unit 604, as in the case of the above header syntax structure signal (Stx_H), outputs a code table selection signal (Sel_F) according to the frame syntax structure signal (Stx_F).

The frame syntax structure signal Stx_F here is information indicating the characteristic of the next code word which is necessary for decoding such next code word. The syntax analyzing unit 604 outputs the code table selection signal Sel_F for switching an output of the code table selecting unit according to the frame syntax structure signal Stx_F in order to decode the next code word. In other words, the syntax analyzing unit 604 generates the code table selection signal Sel_F for switching to an appropriate code table of a plurality of code tables according to a value indicated by the frame syntax structure signal Stx_F. Note that FIG. 3 also uses "InfVal_X", Stx_X", "Sel_X", "Val_X", "Code_X" as generic names common to signals concerning the header information and picture signal information of each frame, as in the case of FIG. 1 described above.

Note that the above-described header streams Str_H illustrated in FIG. 1 and FIG. 3 correspond to the sequence header SeqHdr or the combination of the sequence header SeqHdr and the frame header FrmHdr, and the frame streams Str_F correspond respectively to the frame data FrmData or macroblock data MB illustrated in the stream structure of the conventional picture coded signal in FIG. 2.

Meanwhile, such existing picture coding apparatus and existing picture decoding apparatus described above require a plurality of code tables in order to increase a compression ratio, and there occurs a problem that (1) processing for switching code tables becomes complicated. While this does not pose a particular problem when coding/decoding is performed by a high-performance/large capacity computer, it is difficult to realize this in a mobile terminal and the like with a small memory/low-computing power. In particular, since code tables are frequently switched according to the syntax structure signal (Stx_X) in the code table selecting units 504 and 602 of the existing picture coding apparatus and the existing picture decoding apparatus, processing for switching code tables can be complicated.

Meanwhile, there are two types of variable length coding, which are Huffman coding in which coding is performed using a code table which is relatively easy to decode, and arithmetic coding which involves complex coding/decoding processing but which offers highly-efficient compression. Arithmetic coding is a kind of variable length coding, and a probability used for coding/decoding in arithmetic coding corresponds to a code table. However, when Huffman coding and arithmetic coding co-reside in the same stream in a complicated manner, there is a problem that it is difficult for the aforementioned mobile terminal and the like to realize this since processing for switching between Huffman coding and arithmetic coding in the course of coding and decoding is highly complicated.

The present invention has been conceived in order to solve the above problem, and it is an object of the present invention to provide picture coding methods and picture decoding methods that allow mobile terminals and the like with small memory/low-computing power to carry out data compression equivalent to conventional data compression.

DISCLOSURE OF INVENTION

The present invention is a picture coding method for coding information including picture signals of each frame, wherein the information to be coded includes information concerning a characteristic of the whole picture signal and information concerning the picture signals of each frame, the picture coding method comprising: a plural coding step for performing coding by the use of a plurality of coding methods for the information concerning the characteristic of the whole picture signal; a common coding step for performing coding by the use of a coding method common to each frame for the information concerning the picture signals of each frame; and a multiplexing coding step for performing coding after multiplexing the coded information concerning the characteristic of the whole picture signal and the coded information concerning the picture signals of each frame.

Moreover, the present invention is a picture decoding method for decoding multiplexed information including picture signals of each frame, wherein the information to be decoded includes information concerning a characteristic of the whole picture signal and information concerning the picture signals of each frame, the picture decoding method comprising: a demultiplexing decoding step for demultiplexing the information concerning the characteristic of the whole picture signal and the information concerning the picture signals of each frame from the multiplexed information; a plural decoding step for performing decoding by the use of a plurality of decoding methods for the demultiplexed information concerning the characteristic of the whole picture signal; and a common decoding step for performing decoding by the use of a decoding method common to each frame for the demultiplexed information concerning the picture signals of each frame.

BRIEF DESCRIPTION OF DRAWINGS

FIG. 5 is a stream structure diagram showing a picture coded signal coded in the functional block diagram of the picture coding apparatus illustrated in FIG. 4.

FIG. 6A is a data structure diagram showing general frame data.

FIG. 6B is a data structure diagram showing the above frame data having the slice structure.

FIG. 7A is an example code table used when variable length coding is performed in the picture coding apparatus.

FIG. 7B is an example code table used when fixed length coding is performed in the picture coding apparatus.

FIG. 14 are diagrams showing tables that list the coding methods in the first embodiment and the second embodiment.

BEST MODE FOR CARRYING OUT THE INVENTION

The following explains preferred embodiments according to the present invention with reference to FIG. 4~FIG. 19.

First Embodiment

Figure 4:
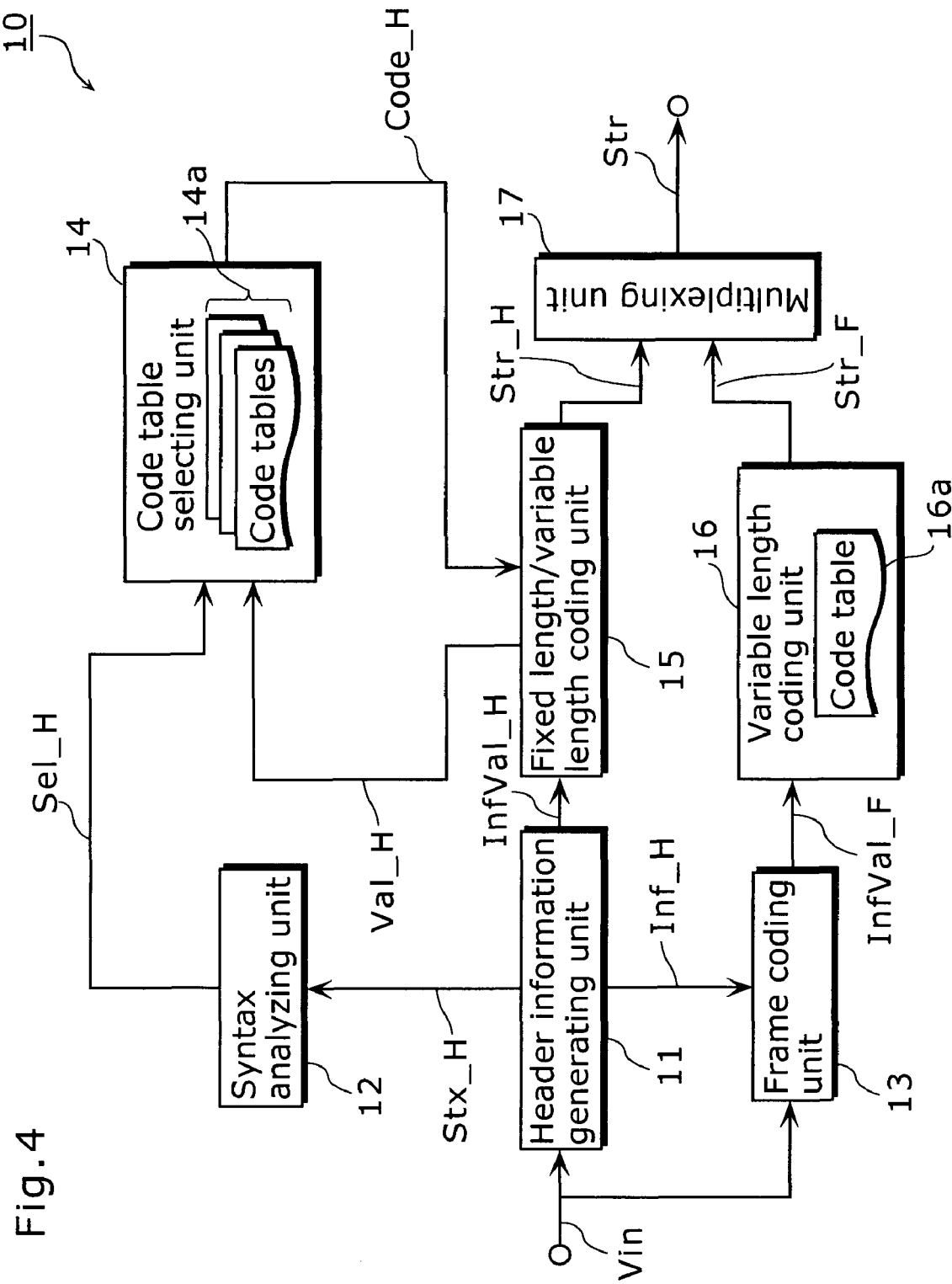
FIG. 4 is a functional block diagram showing units relating to coding functionality of a picture coding apparatus according to the first embodiment.

FIG. 4 is a functional block diagram showing units relating to coding functionality of a picture coding apparatus 10 according to the present embodiment. In FIG. 4, the same numbers are assigned to signals concerning the same operations as those of the signals of the existing picture coding apparatus 500 illustrated in FIG. 1, and explanations thereof are omitted.

The picture coding apparatus 10 according to the present embodiment is characterized by that a plurality of coding methods are employed for the header which is information common to the whole picture signal and that a single coding method is employed for information relating to a picture signal of each frame.

Note that this specification provides explanations for frames, but fields substitute as frames in the case of an interlace picture signal.

Figure 1:
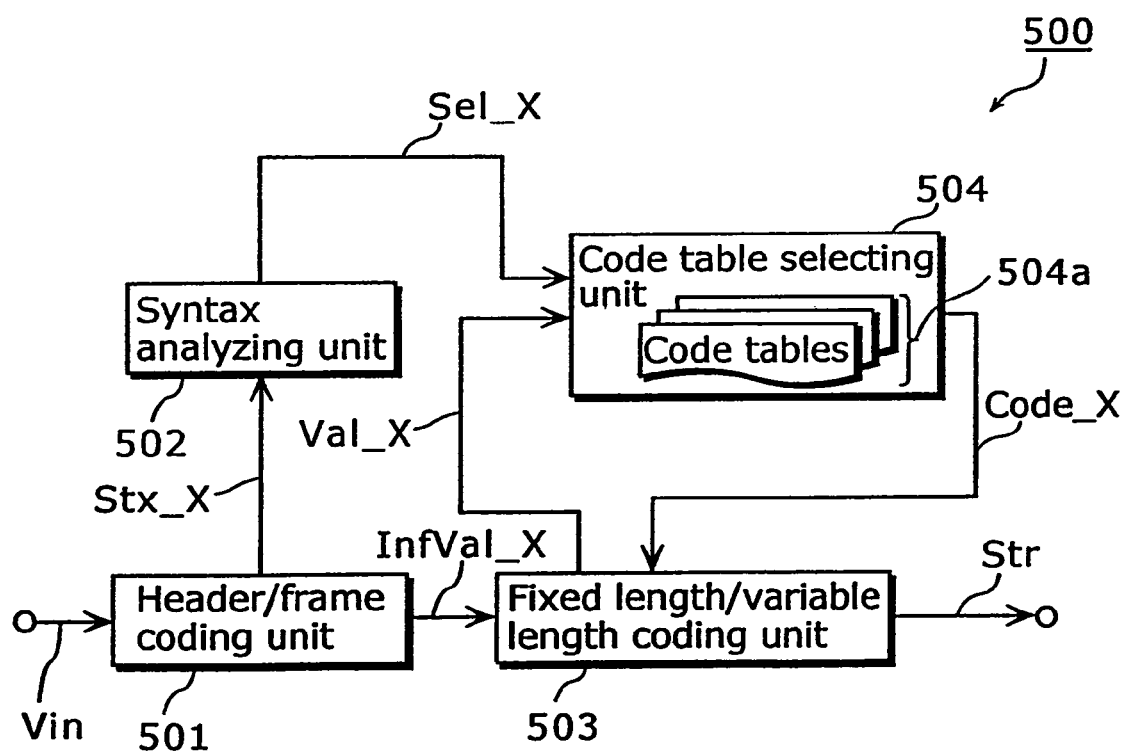
FIG. 1 is a functional block diagram showing units relating to coding functionality of the existing picture coding apparatus 500.
Figure 2:
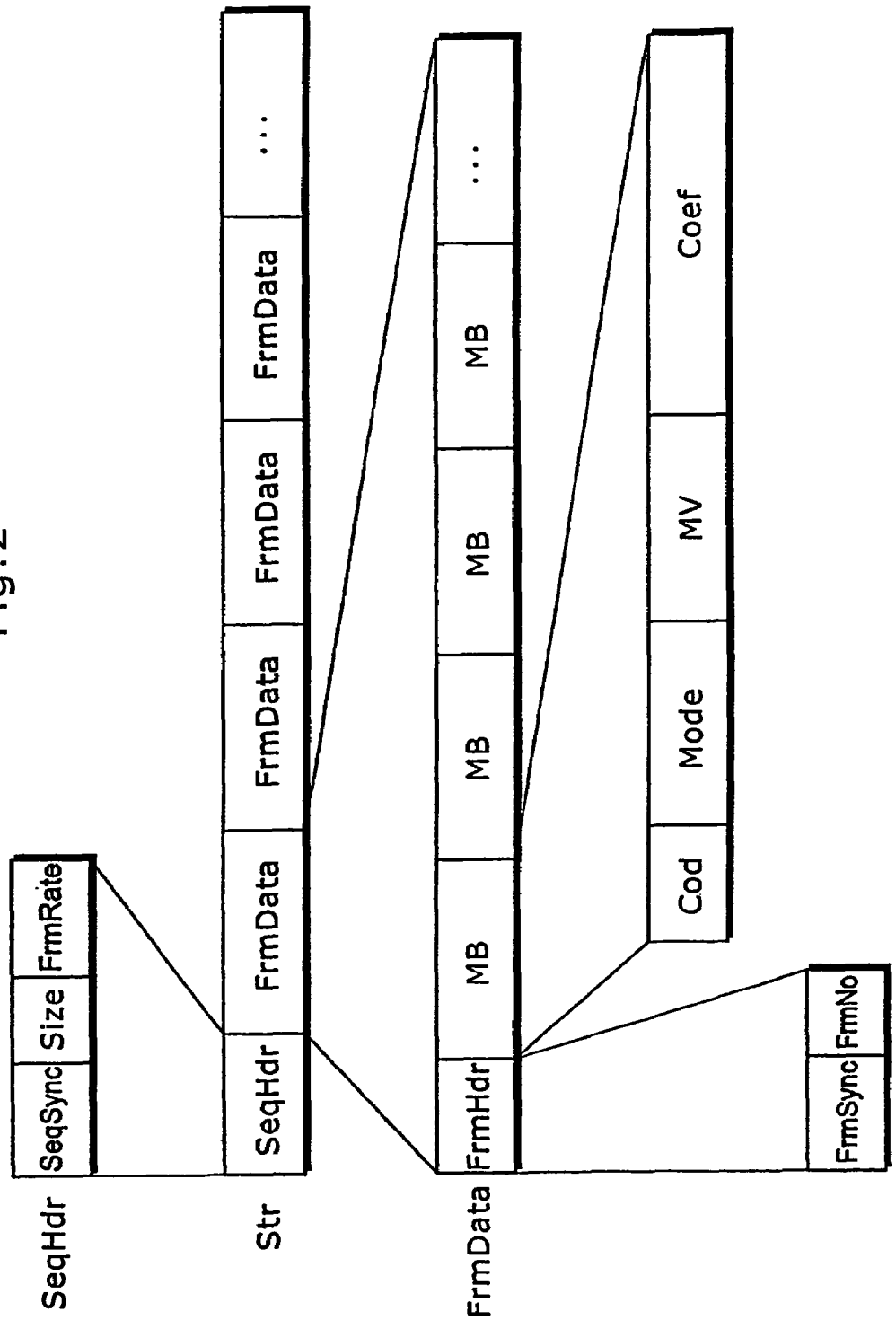
FIG. 2 is a diagram showing a stream structure of a conventional picture coded signal.

Note that configurations for generating and coding header information which is information common to the whole picture signal and operations thereof are identical to those of the above-explained existing picture coding apparatus 500 illustrated in FIG. 1.

As illustrated in FIG. 4, the picture coding apparatus 10 newly includes a frame coding unit 13 and a variable length coding unit 16, as compared to the existing picture coding apparatus 500 described above. Note that a multiplexing unit 17 is embodied by taking out some of the functions of the fixed length/variable length coding unit 503 of the aforementioned existing picture coding apparatus 500.

The frame coding unit 13, which is a unit that generates individual picture signal information from a moving picture signal Vin, outputs to the variable length coding unit 16 a frame code value InfVal_F which is a value to be obtained as a result of coding picture signal information of each frame with reference to a header parameter Inf_H.

The variable length coding unit 16 decomposes the frame code value InfVal_F into unit frame code values Val_F which are basic units of coding, converts such unit frame code values Val_F into frame code words Code_F using only a code table 16a, and constructs a frame stream Str_F by combing such converted frame code words. Accordingly, a single coding method to be commonly used for all frames is employed for information relating to a picture signal of each frame, without switching between coding methods according to syntaxes as in the conventional case.

The multiplexing unit 17 multiplexes the header stream Str_H and the frame stream Str_F, and constructs a picture coded signal Str.

FIG. 5 is a stream structure diagram showing the picture coded signal Str in the picture coding apparatus 10 for which coding has been performed in the functional block diagram illustrated in FIG. 4. As illustrated in FIG. 5, such stream is made up of a sequence header SeqHdr and a plurality of frame data FrmData. In this case, the sequence header SeqHdr is information common to the whole picture signal and frame data FrmData is a piece of data that is coded by the use of only the code table 16a.

Note that the sequence header SeqHdr and the frame data FrmData do not necessarily have to be transmitted consecutively within the same stream and therefore that each of them may be transmitted in a different stream, as long as the sequence header SeqHdr can be recognized first at the decoding apparatus side.

FIG. 6 is a data structure diagram showing frame data illustrated in FIG. 5.

FIG. 6A is a data structure diagram showing general frame data FrmData. In this case, an example case is shown where the frame header FrmHdr of the frame data FrmData is coded by the use of a plurality of coding methods (code tables) as common information of the whole picture signal, while macroblock data MB are coded by the use of a single coding method (e.g. only the code table 16a). In this case, since macroblock data MB which occupy most of the stream are coded by the use of a single coding method (e.g. only the code table 16a) in coding/decoding, there is no need for processing for switching coding methods (code tables) which is required in the conventional case, meaning that it is possible to achieve a simplified picture coding apparatus having functionality equivalent to that of existing picture coding apparatuses.

Note that the frame header FrmHdr and the macroblock data MB do not necessarily have to be transmitted consecutively within the same stream. Each of them may be transmitted in a discontinuous manner within the same frame or may be transmitted in a different stream as long as the frame header FrmHdr can be recognized first at the decoding apparatus side.

In the stream structure shown in FIG. 6A, the frame header FrmHdr of the frame data FrmData is described as common information of the whole picture signal. Note, however, that when one frame is constructed by further combining a plurality of macroblocks as seen in the slice structure of MPEG-1 and MPEG-2 as well as the video packet structure of MPEG-4, and when such common information (header) as a synchronizing signal is placed at the top of such combination of macroblocks, the header of the combination of the macroblocks may be configured as information common to the whole picture signal and picture data other than the header may be coded by the use of the single code table 16a. Such frame made up of the combination of the macroblocks is referred to as a slice (Slice).

FIG. 6B is the data structure of frame data having the slice structure mentioned above. A slice header SliceHdr is set as information common to the whole picture signal and coded by the use of a plurality of code tables, and macroblock data of each slice Slice are coded by the use of the single code table 16a. Note that the slice header SliceHdr and macroblock data MB do not necessarily have to be transmitted consecutively within the same stream. Each of them may be transmitted in a discontinuous manner within the same frame or may be transmitted in a different stream, as long as the slice header SliceHdr can be recognized first at the decoding apparatus side.

FIG. 7 shows examples of a code table used in the present embodiment. FIG. 7A is an example code table used when variable length coding is performed in the picture coding apparatus 10. As illustrated in FIG. 7A, the code length of code words corresponding to data "0"~"2" that occur with a high frequency is shorter, and the code length of code words corresponding to "3"~"6" that occur with a low frequency is longer.

Meanwhile, FIG. 7B is an example code table when fixed length coding is performed in the picture coding apparatus 10. As FIG. 7B shows, the code lengths of code words corresponding to each data are equal, but the code length of code words becomes longer with the increase in the maximum number of frames to be memorized.

Figure 8:
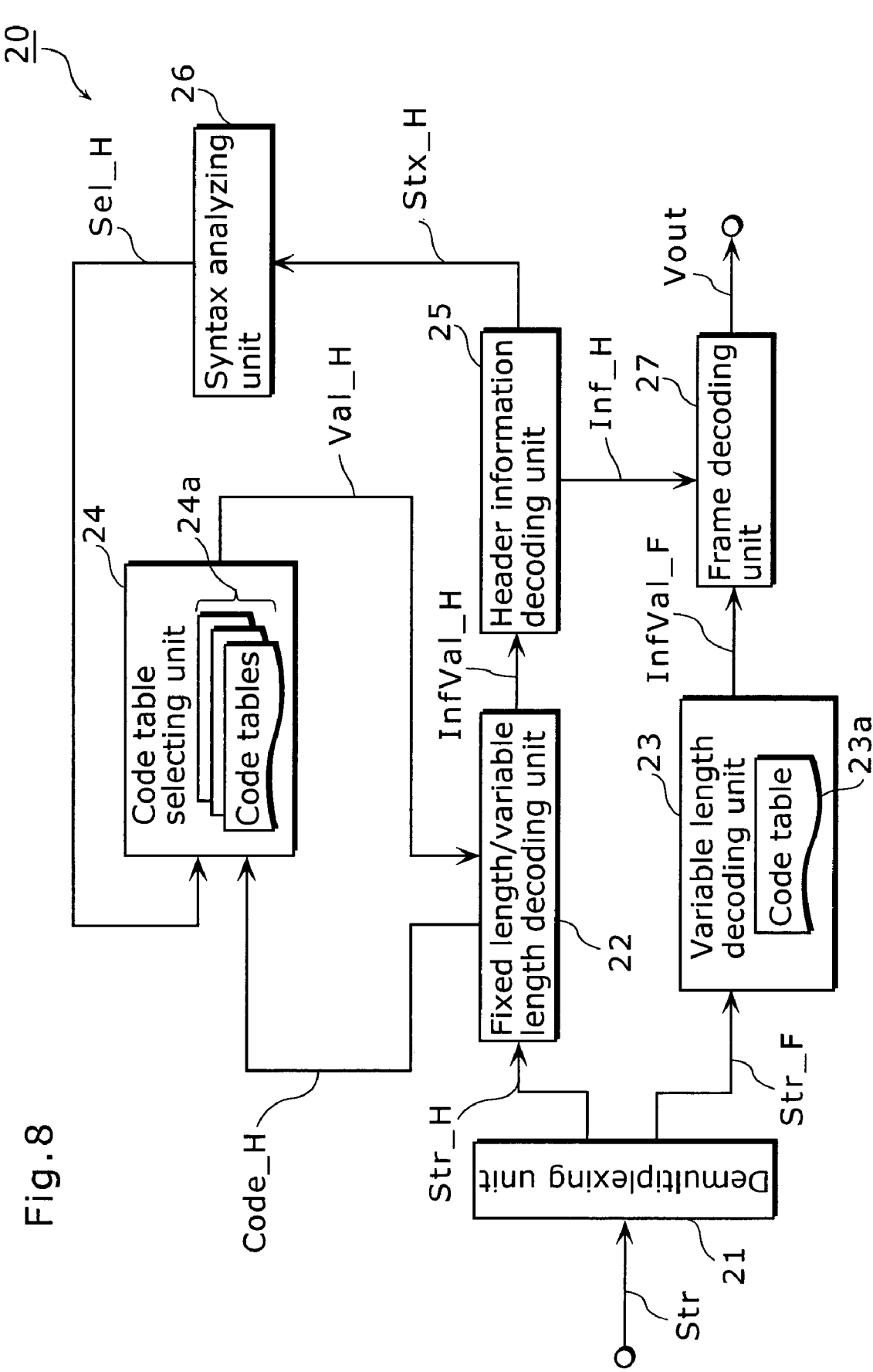
FIG. 8 is a functional block diagram showing units relating to decoding functionality of a picture decoding apparatus according to the first embodiment.

FIG. 8 is a functional block diagram showing units relating to decoding functionality of a picture decoding apparatus 20 according to the present embodiment. The picture decoding apparatus 20 decodes the picture coded signal Str coded by the picture coding apparatus 10, and outputs a decoded moving picture signal Vout. In FIG. 8, the same numbers are assigned to signals concerning the same operations as those of the signals in the existing picture decoding apparatus 600 illustrated in FIG. 3, and explanations thereof are omitted.

Figure 3:
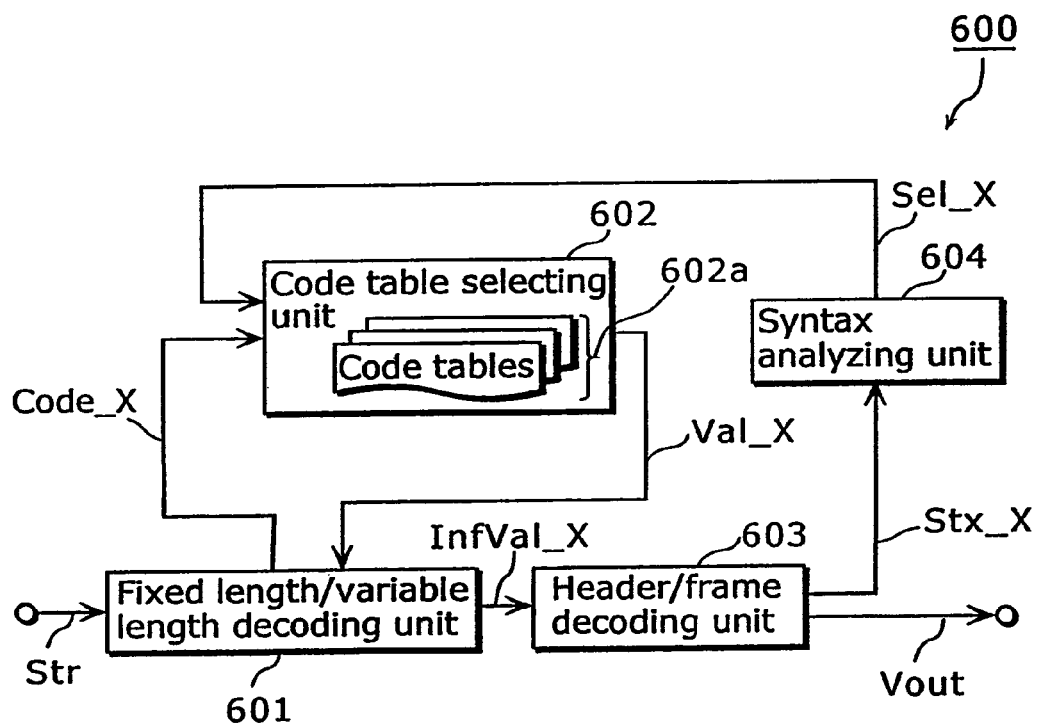
FIG. 3 is a functional block diagram showing units relating to decoding functionality of the existing picture decoding apparatus 600.

Note that configurations for decoding the header information which is information common to the whole picture signal and operations thereof are identical to those of the existing picture decoding apparatus 600 illustrated in FIG. 3.

A demultiplexing unit 21 acquires the picture coded signal Str, and demultiplexes it into the header stream Str_H and the frame stream Str_F. A variable length decoding unit 23 converts the frame code words Code_F making up the frame stream Str_F into unit frame code values Val_F by the use of only the code table 16a, and constructs the frame code value InfVal_F which is a value of the signal coded from the unit frame code values Val_F. A frame decoding unit 27 decodes the frame code value InfVal_F referring to the header parameter Inf_H which is information common to the whole picture signal, and outputs the decoded moving picture signal Vout.

As described above, since it is possible to decode the information other than the header which is information common to the whole picture signal by the use of only the single code table 16a, there is no need for processing for frequently switching decoding methods (code tables) which are required in the existing case, meaning that it is possible to achieve a simplified picture decoding apparatus having functionality equivalent to the conventional decoding apparatuses.

Note that the header information which is information common to the whole picture signal corresponds to the sequence header SeqHdr in the stream structure of the picture coded signal illustrated in FIG. 5 and to the frame header FrmHdr of the frame data illustrated in FIG. 6A. As in the case of the picture coding apparatus 10 described above, macroblock data MB may be decoded by the use of a single code table 23a. Furthermore, as in the case of the picture coding apparatus 10 described above, when the stream structure of a picture coded signal is the slice structure, the slice header SliceHdr may be set as information common to the whole picture signal and the information other than the slice header may be decoded by the use of only the single code table 23a.

Next, an explanation is given for the operations of the picture coding apparatus 10 with the above configuration.

Figure 9:
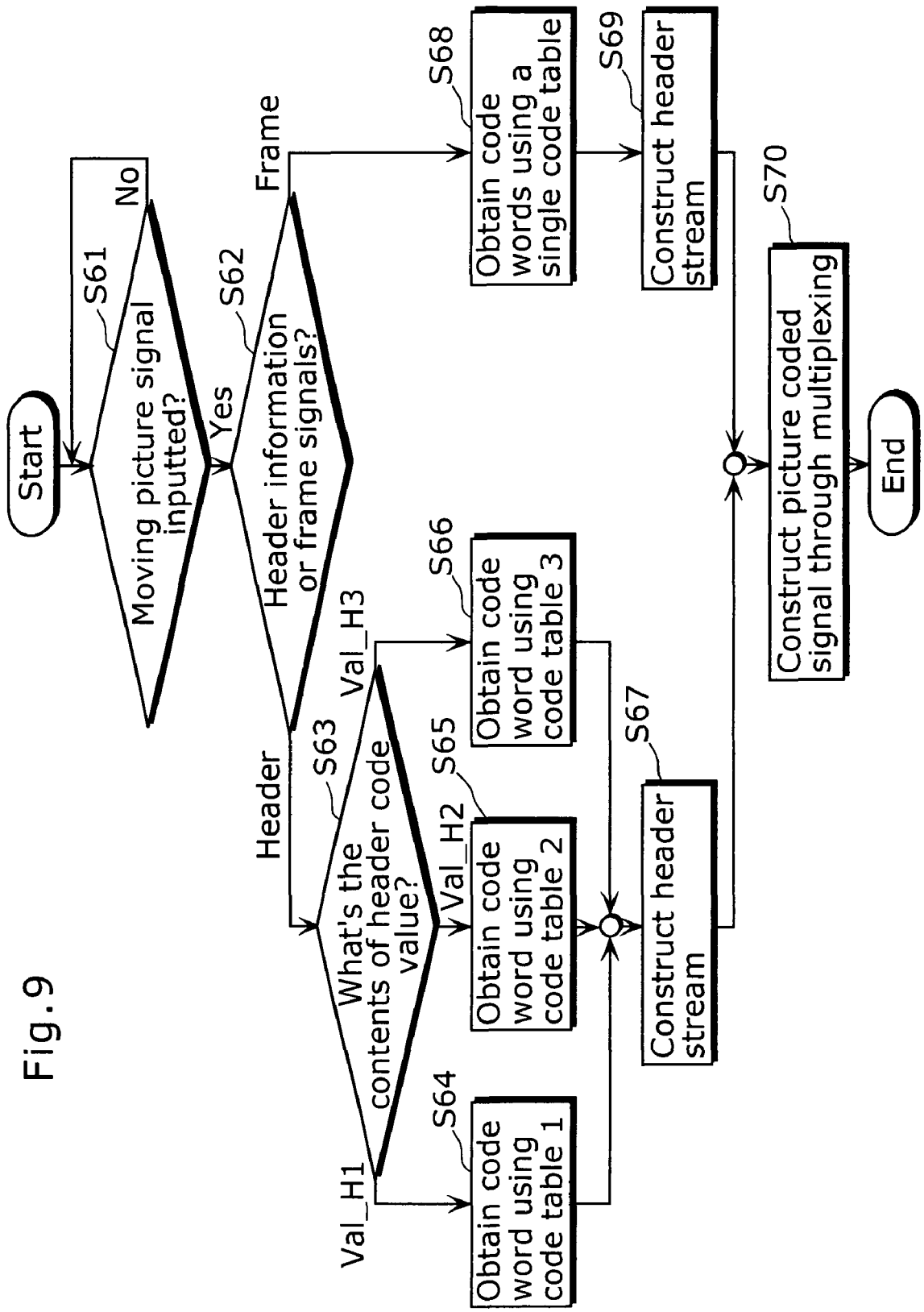
FIG. 9 is a flowchart showing a flow of coding processing of the picture coding apparatus according to the first embodiment.

FIG. 9 is a flowchart showing the flow of coding processing of the picture coding apparatus 10.

First, when the moving picture signal Vin is inputted to a header information generating unit 11 (S61), a code table used for coding the header code value InfVal_H is selected on the basis of the header syntax structure signal Stx_H (S63). The header information generating unit 11 and a fixed length/variable length coding unit 15 generate header information on the basis of the moving picture signal Vin through a method equivalent to the conventional one, select and code the code tables according to the decomposed unit header code values (Val_H) (S64~S66), and construct the header stream (S67).

Meanwhile, a frame coding unit 13, on the acquisition of the moving picture signal Vin (S61), performs coding for the information other than the header information by the use of only the code table 16a (S68), and constructs the frame stream (S69).

A multiplexing unit 17 multiplexes the header stream and the frame stream so as to construct a picture coded signal (S70).

Figure 10:
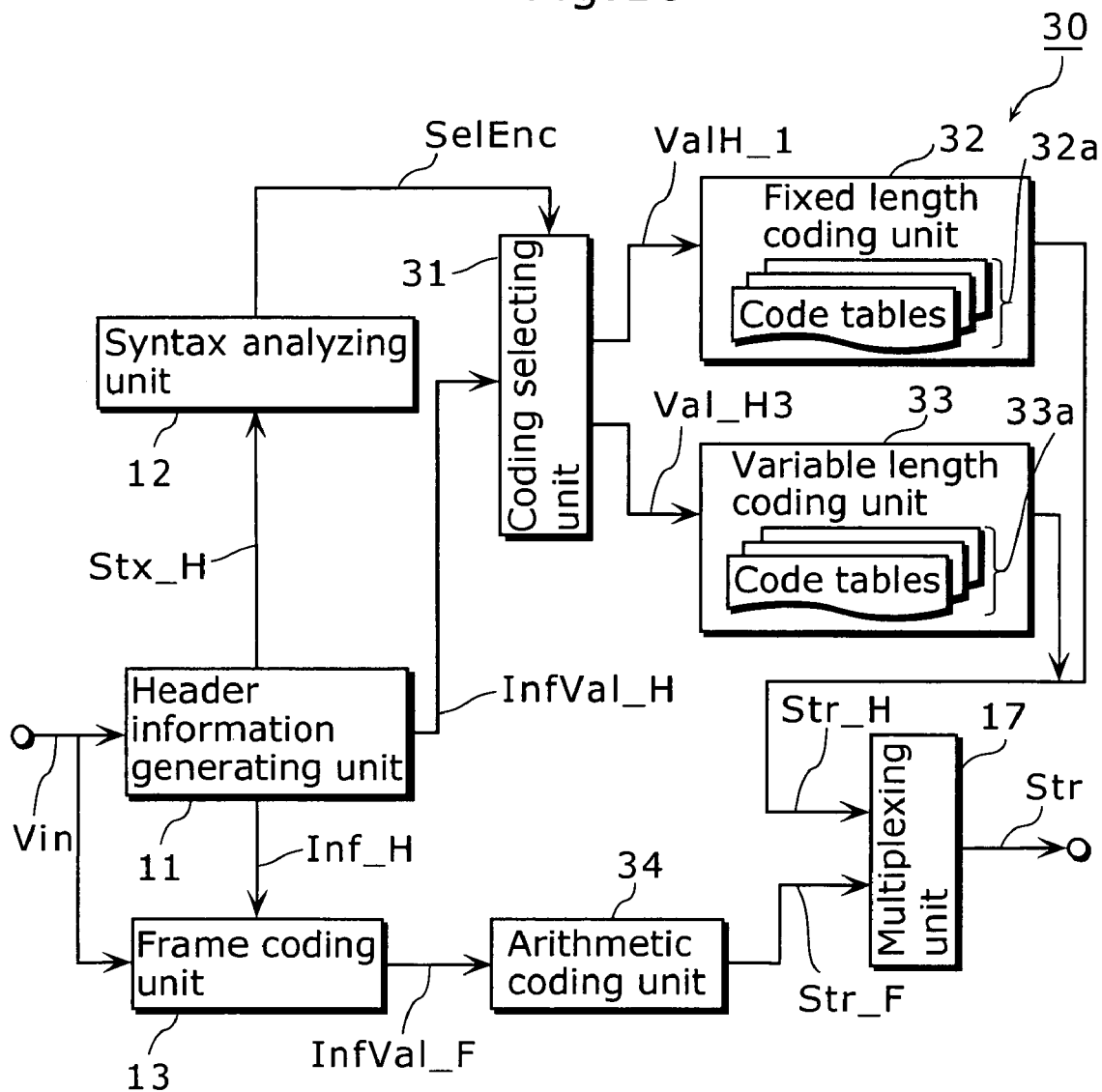
FIG. 10 is a functional block diagram relating to coding functionality of a picture coding apparatus according to the second embodiment.

As described above, according to the picture coding apparatus and the picture decoding apparatus according to the present embodiment, since macroblock data occupying most of the coding processing and decoding processing are coded and decoded by the use of a single code table, there is no need for processing for frequently switching code tables which is required in the conventional case, meaning that it is possible to achieve a simplified picture coding apparatus having functionality equivalent to that of the conventional coding apparatus Second Embodiment FIG. 10 is a functional block diagram showing units relating to coding functionality of a picture coding apparatus 30 according to the present embodiment. In FIG. 10, the same numbers are assigned to signals concerning the same configurations and operations thereof as those in the functional block diagram of the picture coding apparatus 10 illustrated in FIG. 4, and explanations thereof are omitted.

Descriptions are provided for the difference between the picture coding apparatus 30 in FIG. 10 and the picture coding apparatus 10 in FIG. 4. The unit in the picture coding apparatus 10 that generates header information which is common information of the whole picture signal, performs coding after selecting appropriate code tables from a plurality of code tables, while the other individual picture signal information are coded by the use of a single code table. The picture coding apparatus 30, on the other hand, performs coding for header information which is common information of the whole picture signal through a fixed length coding method or an ordinary variable length coding (Huffman coding) method in which code tables are used, and the other individual picture signal information are coded only through arithmetic coding.

Arithmetic coding involves slightly complicated coding/decoding processing as compared with such ordinary variable length coding as Huffman coding in which code tables are used, but is known as a method through which a compression rate is increased. Therefore, by performing, in the course of decoding, ordinary variable length coding for header information which is particularly important and which is wide in variety, it is possible to make a quick judgment as to what kind of decoding should be performed for frame data. Since arithmetic coding is weak against transmission errors and the like, significant effects in terms of improving error resilience can be achieved by performing ordinary variable length coding for header information which is an important piece of data.

Moreover, considering that processing for switching from arithmetic coding to ordinary variable length coding is particularly complicated, requiring a redundant number of bits, it is not wise to make frequent switches between arithmetic coding and ordinary variable length coding.

A syntax analyzing unit 12 outputs to a coding selecting unit 31a coding selection signal SelEnc for switching an output of the coding selecting unit 31 according to a header syntax structure signal Stx_H.

The coding selecting unit 31 selects either a fixed length coding method or a variable length coding method according to a coding selection signal SleEnc, and coding is performed either in a fixed length coding unit 32 or a variable length coding unit 33 in accordance with the selected coding method so as to construct a header stream Str_H, and outputs it to the multiplexing unit 17.

An arithmetic coding unit 34 performs arithmetic coding for a code value InfVal_F referring to a header parameter Inf_H, constructs a frame stream Str_F for which arithmetic coding has been performed, an outputs it to the multiplexing unit 17.

The multiplexing unit 17 multiplexes the header stream Str_H and the frame stream Str_F so as to construct a picture coded signal Str.

As described above, by switching coding methods according to syntaxes in order to perform coding for the header information which is common information of the whole picture signal, and by coding individual picture signal information only through arithmetic coding in the picture coding apparatus 30 according to the present embodiment, it is possible to achieve a picture coding apparatus that allows a simplified processing for switching coding methods without lowering coding efficiency.

Figure 11:
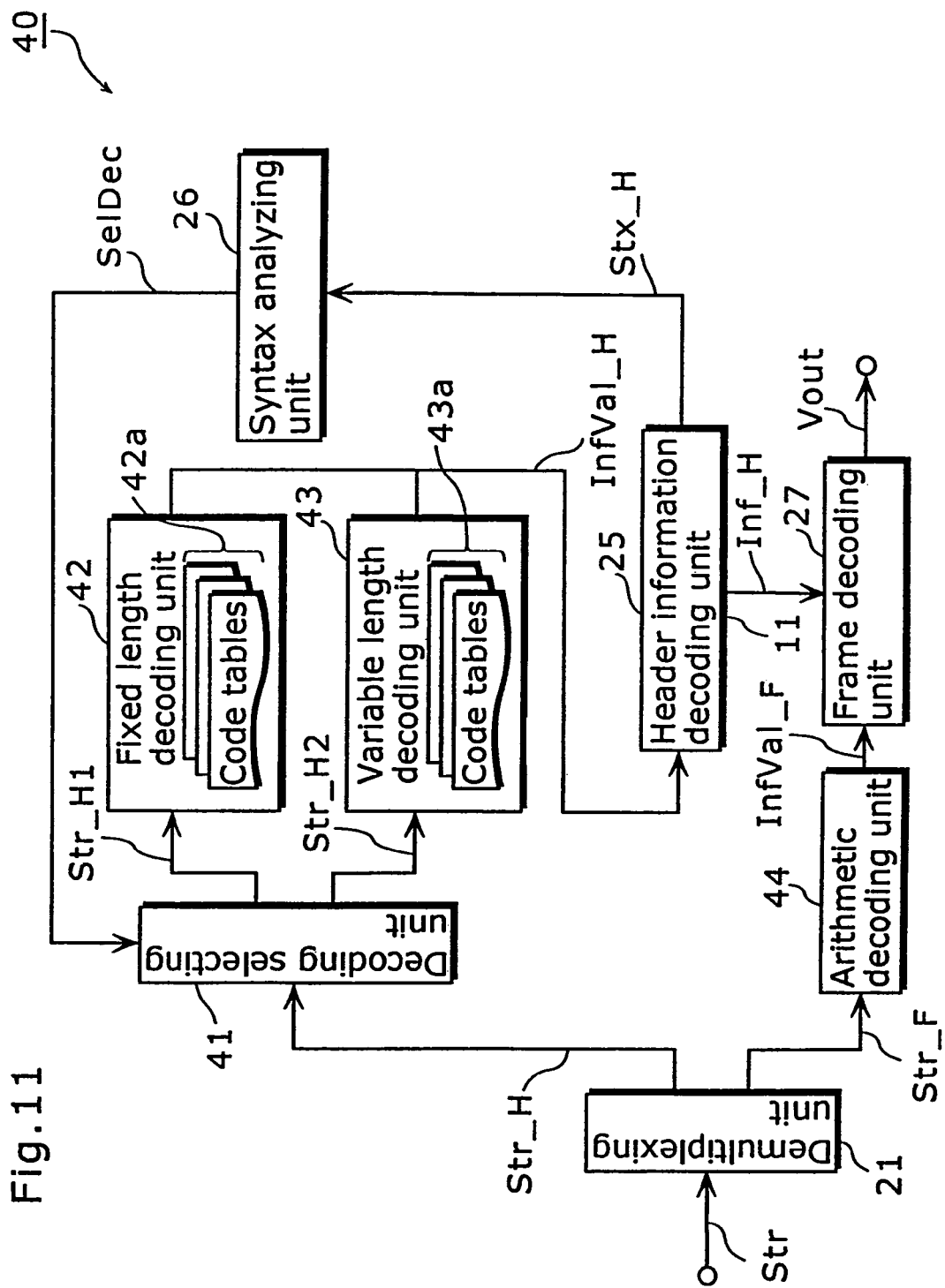
FIG. 11 is a functional block diagram relating to decoding functionality of a picture decoding apparatus according to the second embodiment.

FIG. 11 is a functional block diagram relating to decoding functionality of a picture decoding apparatus 40 according to the present embodiment. Note that in FIG. 11, the same numbers are assigned to signals concerning the same functional configurations and the same operations as those of the picture decoding apparatus 20 illustrated in the functional block diagram of the first embodiment, and explanations thereof are omitted.

Descriptions are provided for the difference between the picture decoding apparatus 40 in FIG. 11 and the picture decoding apparatus 20 according to the first embodiment. The picture coding apparatus 20, when decoding the header information which is common information of the whole picture signal, selects appropriate code tables from a plurality of code tables so as to perform decoding. While the picture decoding apparatus 20 decodes the other individual picture signal information by the use of a single code table, the picture decoding apparatus 40, when decoding the header information which is common information of the whole picture signal, performs decoding as an inverse processing of a fixed length decoding method or an ordinary variable length coding (Huffman coding) method utilizing code tables, while decodes the other individual picture signal information only through arithmetic coding. Note that the picture decoding apparatus 40 in FIG. 11 is an apparatus for decoding the picture coded signal Str which has been coded by the picture coding apparatus 30 in FIG. 10.

A syntax analyzing unit 26 outputs a decoding selection signal SelDec for switching an output of a decoding selecting unit 41 according to the header syntax structure signal Stx_H. The decoding selecting unit 41 selects either a fixed length decoding method or a variable length decoding method according to the decoding selection signal SelDec, and outputs to a header information decoding unit 25 the header code value InfVal_H which has been decoded either by a fixed length decoding unit 42 or a variable length decoding unit 43 depending on the selected decoding method.

An arithmetic decoding unit 44 performs arithmetic decoding for the frame stream Str_F referring to the header parameter Inf_H, and constructs the frame code vale InfVal_F for which arithmetic decoding has been performed. A frame decoding unit 27 decodes the frame code value InfVal_F referring to the header parameter Inf_H which is information common to the entire signal, and outputs a decoded moving picture signal Vout.

As described above, by switching to an efficient coding method according to syntaxes so as to code the header information which is common information of the whole picture signal and by coding individual picture signal information only through arithmetic coding, it is possible to achieve a picture decoding apparatus which allows a simplified switching processing without lowering coding efficiency.

Note that, other than through the picture coding apparatuses 10 and 30 as well as the picture decoding apparatuses 20 and 40 described above, it is also possible to realize coding and decoding of each piece of information using a plurality of code tables by demultiplexing the header information and individual picture signal information.

Figure 12:
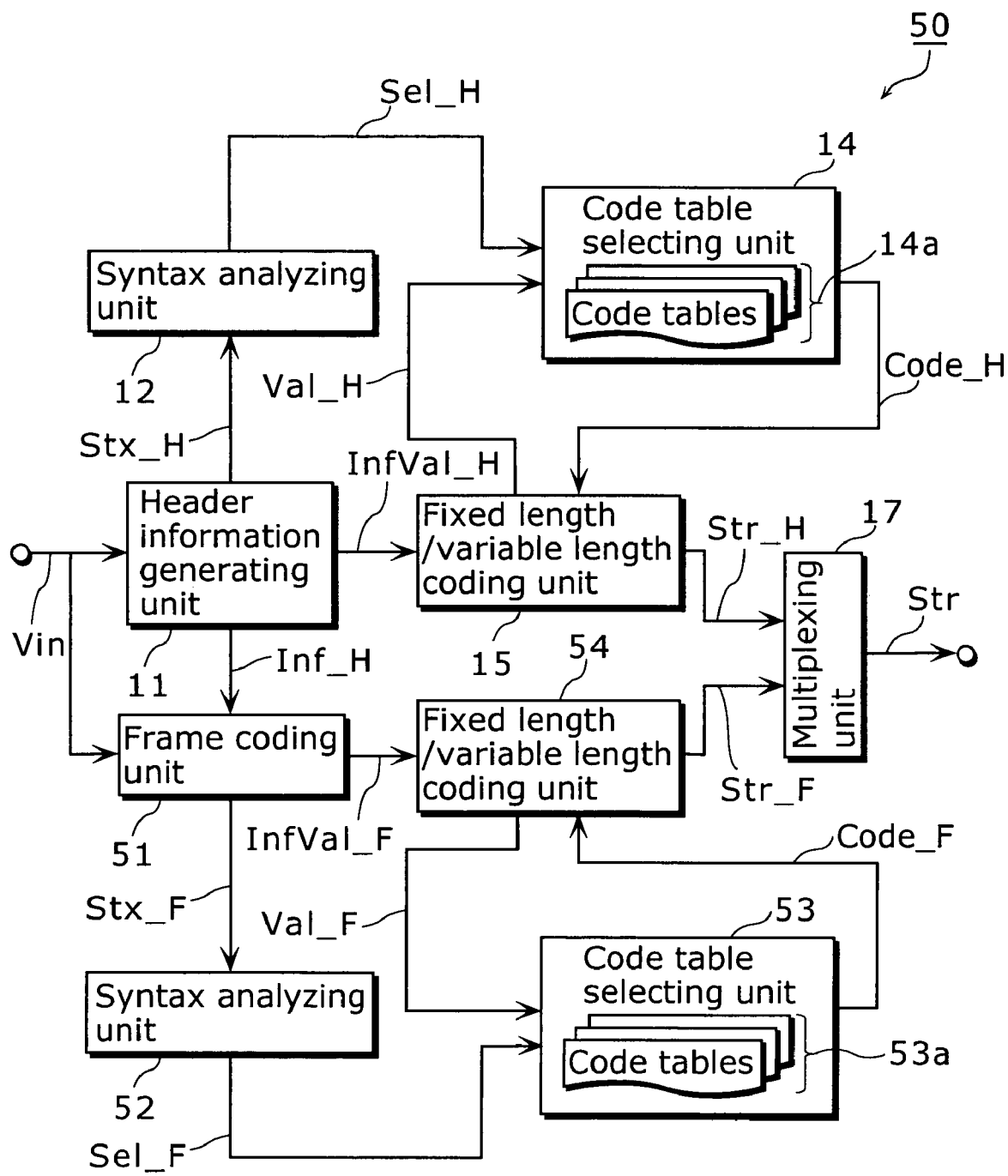
FIG. 12 is a functional block diagram showing units relating to coding functionality of the picture coding apparatus that separates header information and individual picture signal information and performs coding for each of such information.

FIG. 12 is a functional block diagram showing units relating to coding functionality of a picture coding apparatus 50 that separates the header information and individual picture signal information so as to perform coding for each piece of information.

Figure 13:
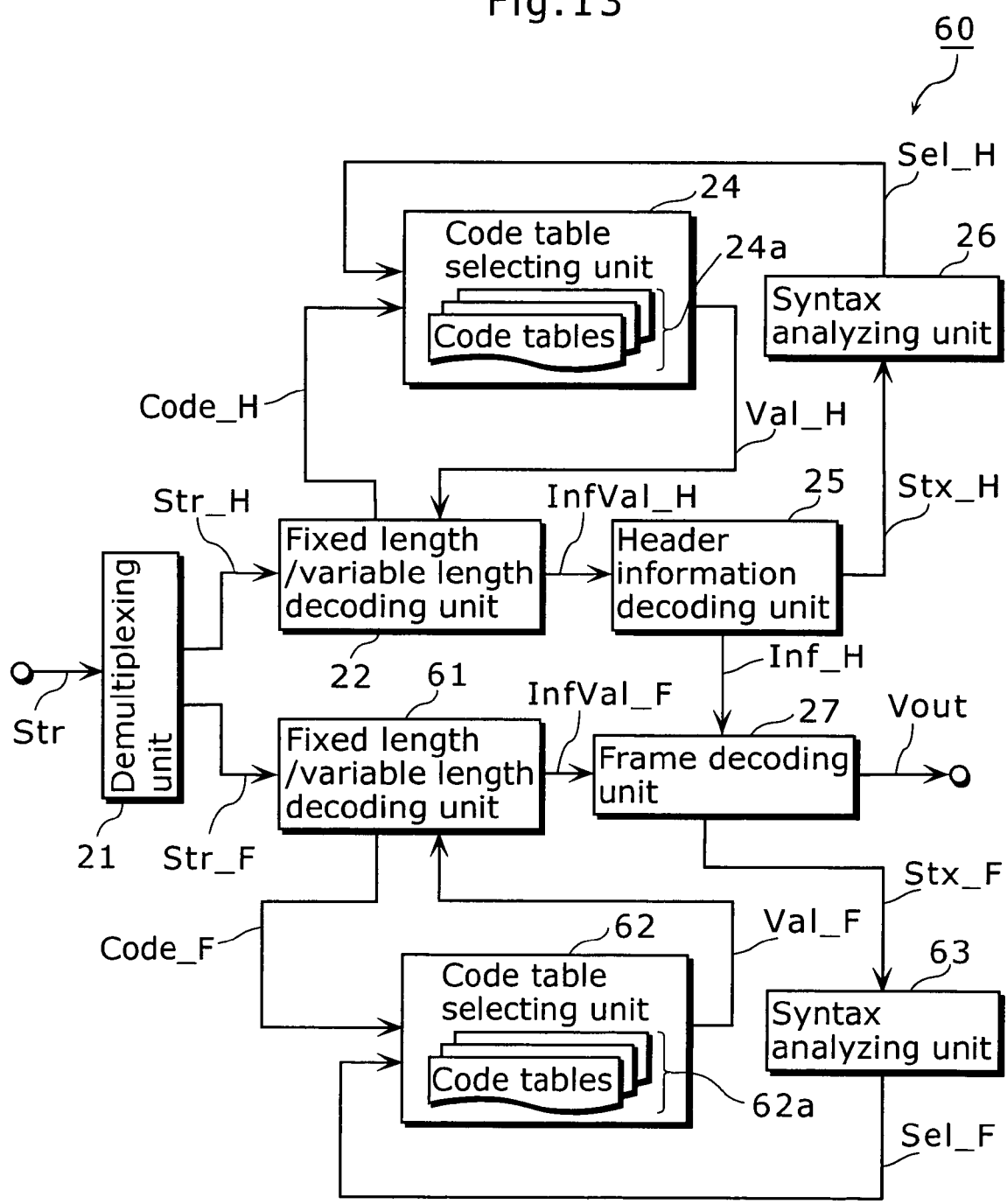
FIG. 13 is a functional block diagram showing units relating to decoding functionality of a picture decoding apparatus paired with the picture coding apparatus illustrated in FIG. 12.

Meanwhile, FIG. 13 is a functional block diagram showing units relating to decoding functionality of a picture decoding apparatus 60 paired with the picture coding apparatus 50 illustrated in FIG. 12.

FIG. 14 shows tables that list coding methods and decoding methods employed in the first embodiment and the second embodiment. In FIG. 14A, as shown in Method 1 for example, when coding header information (described as "Header information" in the diagram) and picture signal information relating to a picture signal of each frame (described as "Frame information" in the diagram), possible methods are an existing coding method utilizing a code table (to be referred to as "code table coding" hereinafter) and coding through an arithmetic coding method (to be referred to as "arithmetic coding" hereinafter). Moreover, it is also possible to perform coding for header information and frame information through arithmetic coding (Method 2) or code table coding (Method 3) respectively.

Furthermore, as illustrated in FIG. 14B, when using code table coding for both header information and frame information, possible cases are ones where a "single" code table is used and where a method utilizing "a plurality of" code tables are used. More specifically, a coding method in which a single code table is used (Method 3-1) or a coding method in which a plurality of code tables are used (Method 3-3) for both header information and frame information may be used. In addition, it is also possible to employ a coding method in which a plurality of code tables are used for header information and a single code table is used for frame information (Method 3-2), or a coding method in which a signal code table is used for header information and a plurality of code tables are used for frame information (Method 3-4).

Note that it should be understood that a single code table or a plurality of code tables may be employed for header information. Here, concerning a plurality of code tables, since specific coding methods are determined for the header which is information common to the whole picture signal and for information relating to a picture signal of each frame, the number of code tables to be employed is limited in advance, which minimizes the number of times for switching code tables.

The coding methods and the decoding methods in the first embodiment and the second embodiment are characterized by that they have a plurality of coding/decoding methods (code tables) for information relating to the entire picture as in the conventional case but a common coding/decoding method is used for individual information relating to a picture signal of each frame. Generally, concerning information relating to the entire picture, since the occurrence frequency of code words making up such information greatly differs from code to code, a compression ratio is considerably decreased unless a plurality of coding/decoding methods are provided. As for individual information, on the other hand, since code words do not differ much in their number of occurrences as compared with information relating to the entire picture, a compression ratio does not get lowered much even if a common coding/decoding method is used. Furthermore, given that most of the processing time for coding/decoding is consumed for the processing intended not for information relating to the entire picture but for individual information, there is a significant effect from the viewpoint of apparatus implementation, if individual information can be coded/decoded through, preferably, a single coding method. When comparing the advantage of switching between a plurality of coding methods including switching between fixed length coding and variable length coding, that it is easier with fixed length coding to detect a synchronizing signal intended for synchronization than with variable length coding and that the use of a plurality of coding methods is suited from the viewpoint of high compression, with the advantage of using a single coding method which allows coding/decoding to be easily realized through a single coding method, this is especially effective in fields of application where the latter advantage is bigger.

Also, considering that arithmetic coding is a kind of variable length coding and that arithmetic coding, while providing a highly efficient coding, requires complicated processing when used after being switched especially from fixed length coding or general variable length coding (Huffman coding), it is preferable that arithmetic coding is used as a single coding method for individual information and a method other than arithmetic coding is used for information relating to the entire picture.

Third Embodiment

It is possible to record a program that realizes the picture coding methods and the picture decoding methods presented in the first embodiment or the second embodiment on a computer-readable recoding medium such as a flexible disk and to carry out the processing presented in each of the above embodiments on such a computer system as a personal computer.

FIG. 15 is a diagram explaining the case where such a program is executed on a computer system by the use of a flexible disk 1201 storing the picture coding methods and the picture decoding methods explained in the first embodiment and the second embodiment.

Figure 15A:
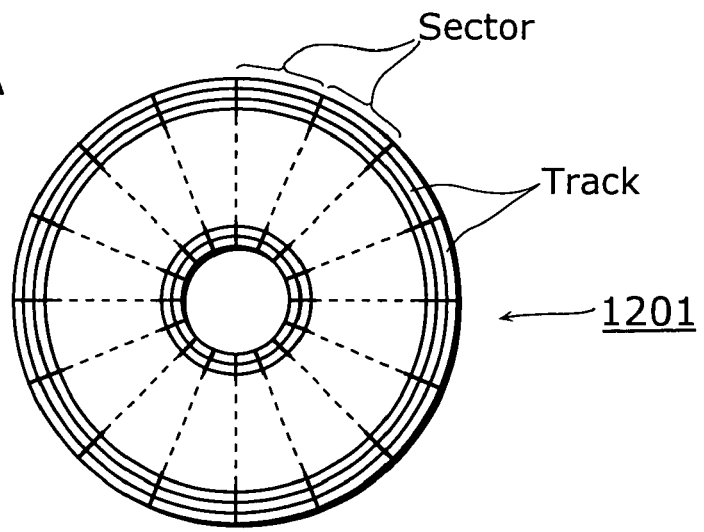
FIG. 15A is a diagram showing an example physical format of a flexible disk which is a recording medium in the third embodiment.
Figure 15B:
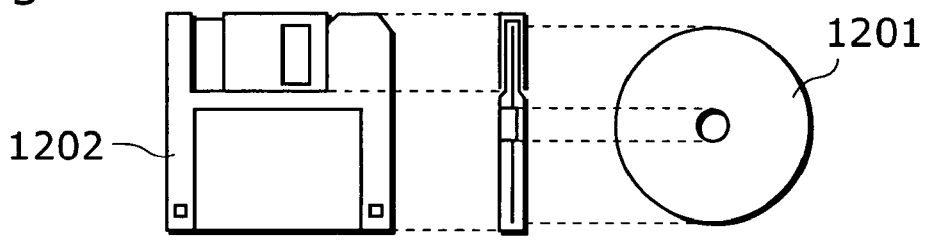
FIG. 15B is a diagram showing an external view of the flexible disk viewed from the front, a schematic cross-sectional view thereof, and the flexible disk.

FIG. 15A illustrates an example physical format of the flexible disk 1201 which is a recording medium. FIG. 15B shows an external view of the flexible disk viewed from the front, a schematic cross-sectional view and the flexible disk. The flexible disk 1201 is contained in a case 1202, and there are a plurality of tracks from the rim to the inner radius concentrically on the surface of the disk, each track being divided into 16 sectors in the angular direction. Therefore, in the flexible disk 1201 storing the above program, the program that realizes the picture coding methods and the picture decoding methods described above is recorded in an allocated area on the disk.

Figure 15C:
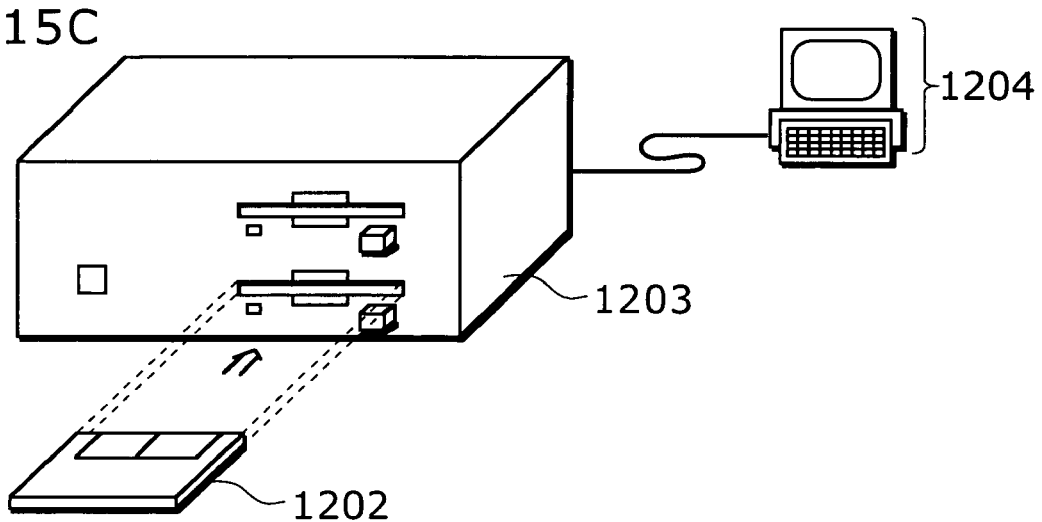
FIG. 15C is a diagram showing an example system structure for recording and reproducing a program to the flexible disk.

Meanwhile, FIG. 15C shows a structure required for recording and reproducing the program on the flexible disk 1201. When recording the program on the flexible disk 1201, the program that realizes the picture coding methods or the picture decoding methods is written via a flexible disk drive 1203 by the use of a computer system 1204. Furthermore, when constructing the picture coding methods inside the computer system 1204 using the program in the flexible disk, the program is read out from the flexible disk 1201 via the flexible disk drive 1203 and is transferred to the computer system.

Note that although the present embodiment explains the case where a flexible disk is used as a recording medium, an optical disc may also be used. Also, a recording medium is not limited to the above example and therefore anything that is capable of recording programs such as an IC card, a ROM cassette and the like is also in the scope of application.

Fourth Embodiment

The following explains an example of the present invention to be applied to a system utilizing the picture coding apparatuses and the picture decoding apparatuses presented in the above preferred embodiments.

Figure 16:
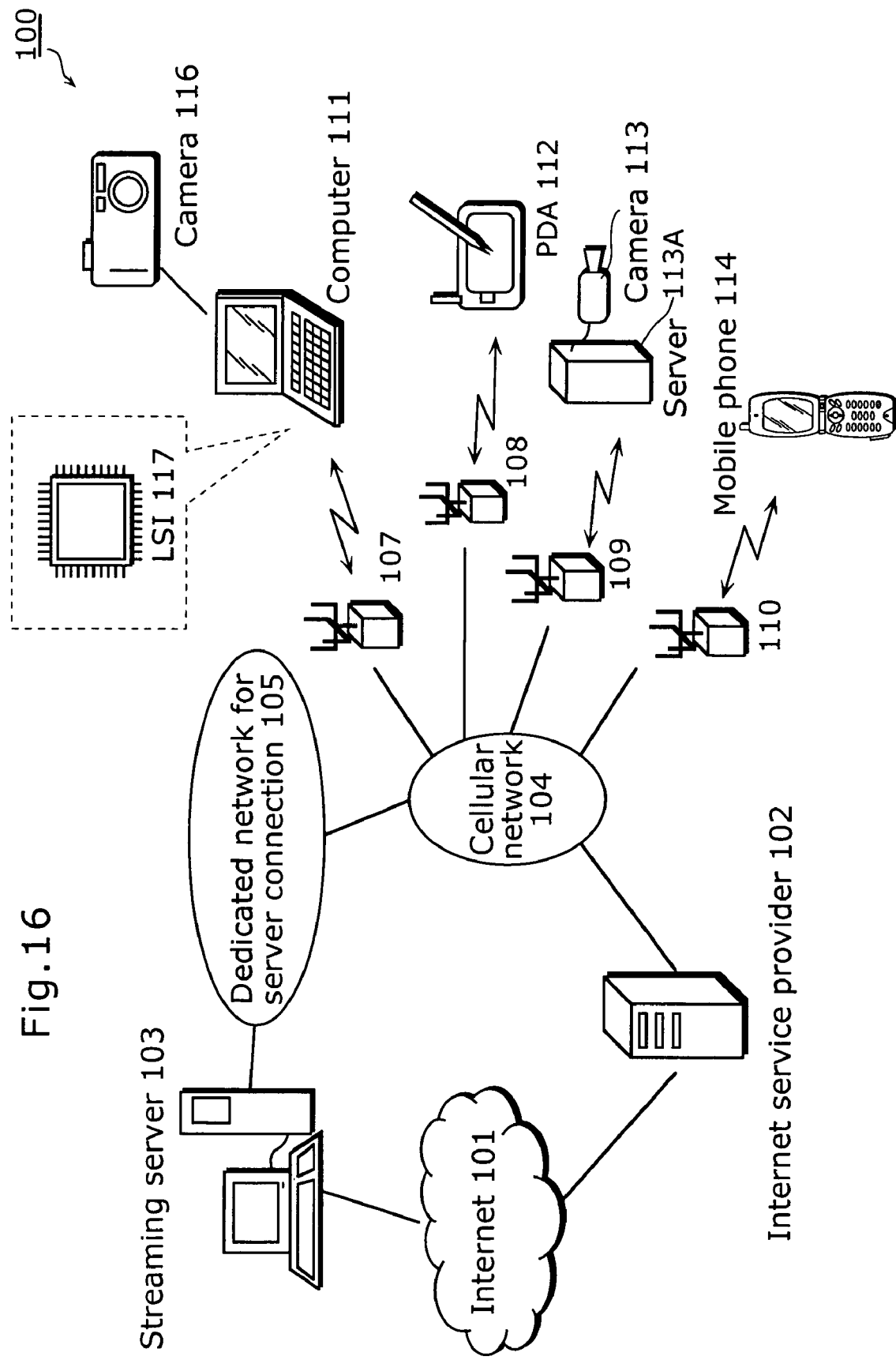
FIG. 16 is a block diagram showing an overview of a content supply system for carrying out content distribution service according to the fourth embodiment.

FIG. 16 is a block diagram showing the general view of a content supply system 100 for carrying out a content distribution service. This content supply system 100 is made up of a cellular network 104 for mobile phones, for example, and is connected to a computer 111, a PDA (Personal Digital Assistants) 112, a camera 113, a mobile phone 114 and others via base stations 107~110.

The camera 113, an example of which is a digital video camera and the like, is capable of taking moving pictures. The mobile phone 115 is a mobile phone in the PDC (Personal Digital Communications) system, the CDMA (Code Division Multiple Access) system, the W-CDMA (Wideband-Code Division Multiple Access) system, or the GSM (Global System for Mobile Communications) system or the like, or a PHS (personal Handyphone Communications) terminal device and the like.

Moreover, a streaming server 103, which is connected to the cellular network 104 via a dedicated network for server connection 105 or the internet 101 and the like, allows the live distribution and the like of coded data of a picture taken by the camera 113. In this case, coding processing for the picture may be performed either by the camera 113 or by a server 113a connected to such camera. It is also possible that picture data of a picture taken by a camera 116 is transmitted to the streaming server 103 via the computer 111. Here, the camera 116 is a digital camera, for example, and is capable of taking still pictures. In this case, coding of the picture data may be performed either by the camera or by the computer 111. Moreover, the above coding processing is performed by an LSI 117 embedded in the camera 116 or the computer 111. Furthermore, picture data taken by a camera-equipped mobile phone 115 may also be transmitted. The picture data in this case is data coded by an LSI incorporated in the mobile phone.

Note that software for picture coding/decoding may be stored in a recording medium (e.g. storage medium including a CD-ROM, a flexible disk, a hard disk or the like) which can be read by the computer 111 or others.

Figure 17:
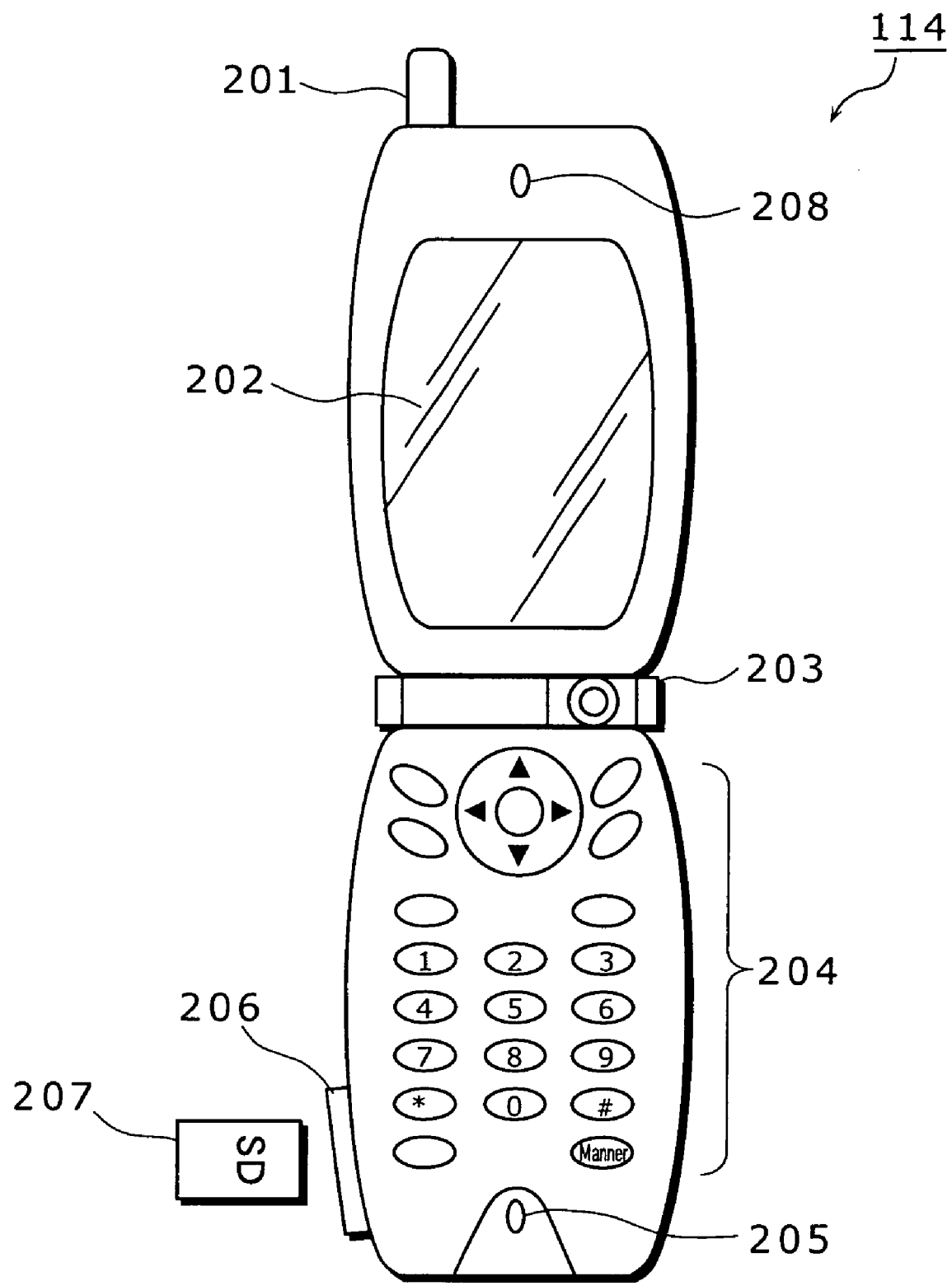
FIG. 17 is an example external view of a mobile phone.

FIG. 17 is an example external view of the mobile phone 114. As FIG. 17 shows, the mobile phone 114 has an antenna 201, a camera unit 203 that employs the CCD system or the like capable of taking moving pictures and still pictures, a displaying unit 202 such as a liquid crystal display and the like to display videos and the like taken by the camera unit 203 and videos and the like received via the antenna 201, a main body 204 having a group of operation keys, a sound outputting unit 208 having a speaker and the like for outputting sound, a sound inputting unit 205 having a microphone and the like for inputting sound, a recording medium 207 for storing data of taken/received moving pictures and still pictures or received mail data and the like, a slot 206 for attaching the recording medium 207. The recording medium 207, an example of which is an SD card, stores inside a plastic case a flash memory which is a kind of volatile memory EEPROM (Electrically Erasable and Programmable Read Only Memory).

In the content supply system 100, while the contents (e.g. shot videos of live music, etc.) taken by the user using the camera 113, the camera 116 and the like is coded and transmitted to the streaming server 103, the streaming server 103 carries out stream distribution for the above content data to a client requesting such content data. Such client can be the computer 111, the PDA 112, the camera 113, the mobile phone 114 and others capable of decoding the coded data.

The content supply system 100 with the above structure makes it possible for a client to receive and reproduce coded data as well as realizing private broadcasting by allowing a client to receive coded data in real time, decode and reproduce it.

Figure 18:
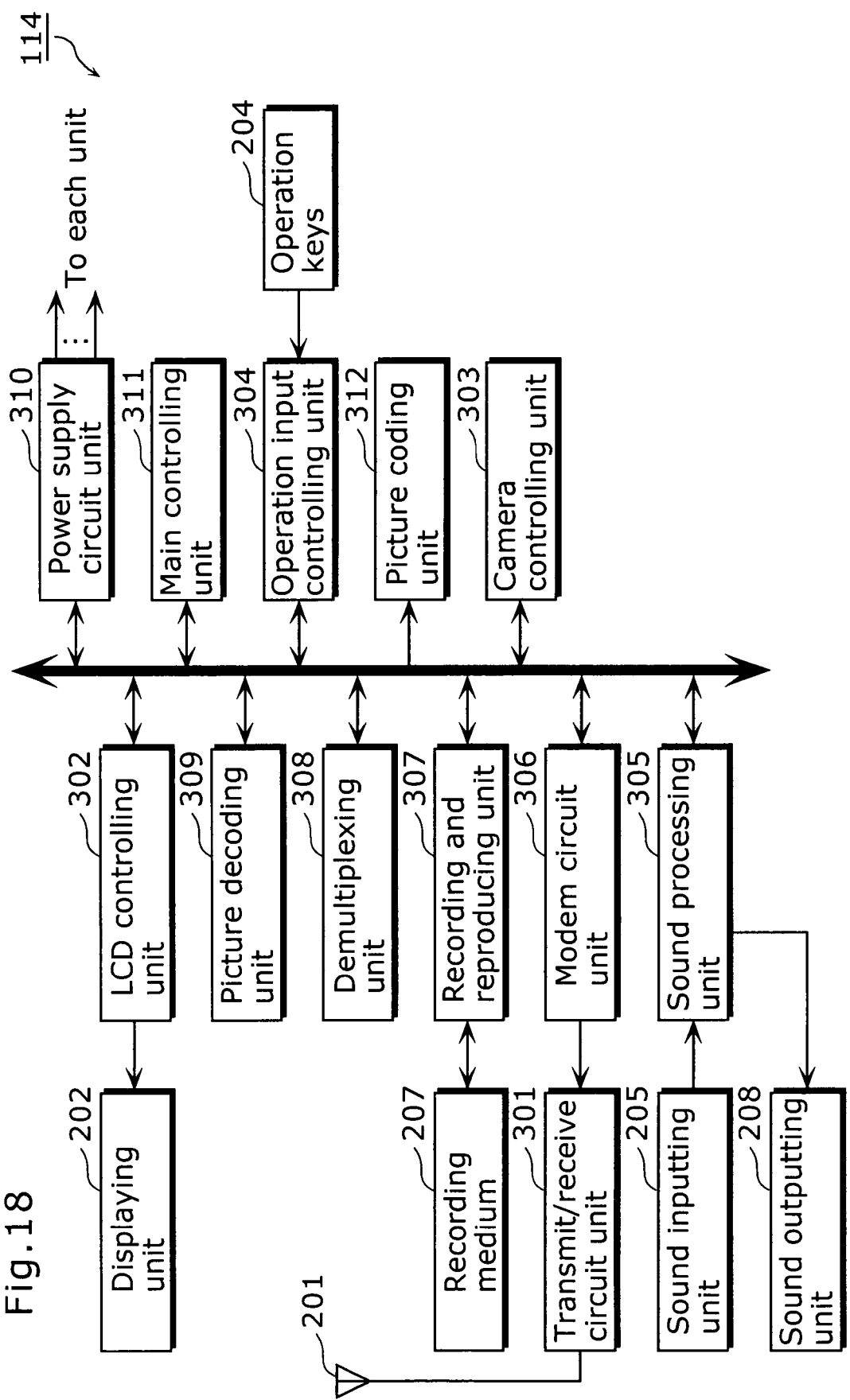
FIG. 18 is an example functional configuration diagram of the mobile phone.

Furthermore, an explanation is given for the mobile phone 114 with reference to FIG. 18. The mobile phone 114 is configured in a manner in which a main controlling unit 311 that has a general control of the displaying unit 202 and each unit of the main body 204, a power supply circuit unit 310, an operation input controlling unit 304, a picture coding unit 312, a camera controlling unit 303, an LCD (Liquid Crystal Display) controlling unit 302, a picture decoding unit 309, a demultiplexing unit 308, a recording and reproducing unit 307, a modem circuit unit 306, and a sound processing unit 305 are interconnected via a bus 313. When the power key is set to ON by a user operation, the power supply circuit unit 310 activates the camera-equipped mobile phone 114 to make it ready for operations by supplying power for each unit from the battery pack. Under the control of the main controlling unit 311 having a CPU, a ROM, a RAM and others, the mobile phone 114 converts a sound signal collected by the sound inputting unit 205 when in the conversation mode to digital sound data in the sound processing unit 305, performs spread spectrum processing for it in the modem circuit unit 306, and after performing digital-analog conversion processing and frequency transform processing in the transmit/receive circuit unit 301, transmits this data via the antenna 201. Furthermore, the mobile phone 114 amplifies the signal received by the antenna 201 while in the conversation mode so as to perform frequency transform processing and analog-digital conversion processing, performs inverse spread spectrum processing in the modem circuit unit 306, and after converting this into an analogue sound signal in the sound processing unit 305, outputs it via the sound outputting unit 208. Furthermore, when sending e-mail while in the data communication mode, text data inputted via the operation input controlling unit 304 on the main body 204 is exported to the main controlling unit 311. The main controlling unit 311 performs spread spectrum processing for the text data in the modem circuit unit 306, and after performing digital-analog conversion processing and frequency transform processing in the transmit/receive circuit unit 301, transmits it to the base station 110 via the antenna 201.

When picture data is transmitted while in the data communication mode, the main controlling unit 311 provides picture data taken by the camera unit 203 to the picture coding unit 312 via the camera controlling unit 303. When picture data is not to be transmitted, it is possible to directly display the picture data taken by the camera unit 203 on the display unit 202 via the camera controlling unit 303 and the LCD controlling unit 302.

By performing compression coding for the picture data provided from the camera unit 203 using the coding methods presented in the above embodiments, the picture coding unit 312 converts the picture data to coded picture data, and transmits it to the demultiplexing unit 308. When this is done, the mobile phone 114 transmits sound collected by the sound inputting unit 205 while the picture is being taken by the camera unit 203, to the demultiplexing unit 308 as digital sound data via the sound processing unit 305.

The demultiplexing unit 308 multiplexes the coded picture data provided from the picture coding unit 312 and the sound data provided from the sound processing unit 305 through a specified method and performs spread spectrum processing for the resulting multiplexed data in the modem circuit unit 306, and after performing digital-analog conversion processing and frequency transform processing in the transmit/receive circuit unit 301, transmits it via the antenna 201.

When receiving moving picture file data linked on a Web page and the like while in the data communication mode, inverse spread spectrum processing is performed by the modem circuit unit 306 for a signal received from the base station 110 via the antenna 201, and the resulting multiplexed data is delivered to the demultiplexing unit 308.

In order to decode the multiplexed data received via the antenna 201, the demultiplexing unit 308 divides such multiplexed data into the coded picture data and the sound data by demultiplexing it, and provides the coded picture data to the picture decoding unit 309 while providing the sound data to the sound processing unit 305 via the bus 313 at the same time.

Next, the picture decoding unit 309 generates moving picture data for playback by decoding the coded picture data through decoding methods used in a pair with the coding methods presented in the above embodiments, and provides it to the display unit 202 via the LCD controlling unit 302, as a result of which the picture data included in the moving picture file linked to a Web page, for example, can be displayed. When this is done, the sound processing unit 305 converts the sound data to an analog sound signal at the same time and then provides it to the sound outputting unit 208, as a result of which the sound data included in the moving picture file linked to a Web page, for example, can be reproduced.

Figure 19:
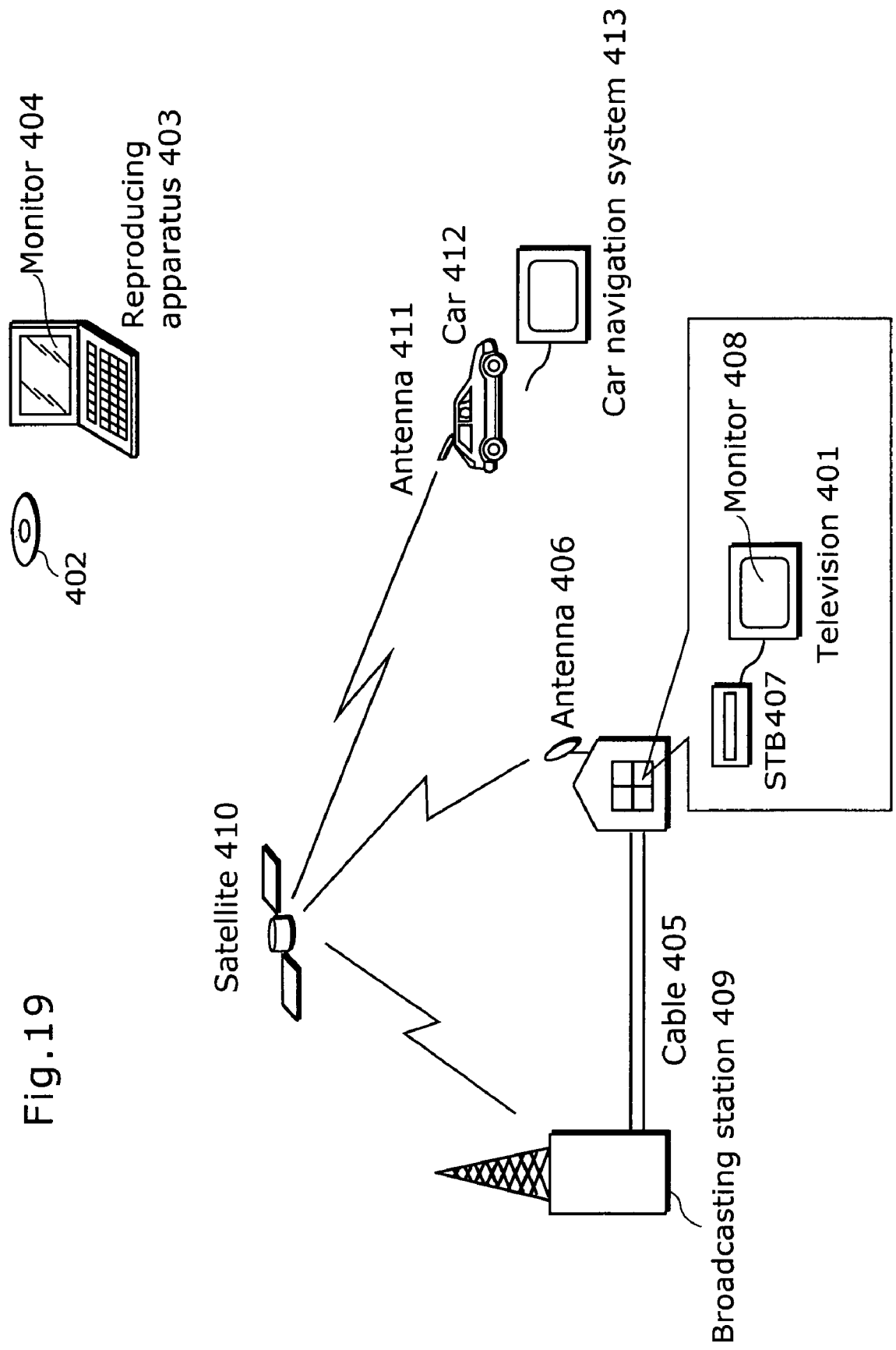
FIG. 19 is an example system structure diagram of a digital broadcasting system.

Note that the aforementioned system is not an exclusive example and therefore that at least either the coding methods or the decoding methods of the above embodiments can be incorporated into a digital broadcasting system as shown in FIG. 19, against the backdrop that satellite/terrestrial digital broadcasting has been a recent topic of conversation. To be more specific, at a broadcasting station 409, a coded bit stream of video information is transmitted to a satellite 410 for communications, broadcasting or the like by radio waves. The satellite 410 that has received this receives broadcast radio waves, receives such radio waves by an antenna 406 of a house equipped with satellite broadcasting reception facilities, and the coded bit stream are then decoded by such an apparatus as a television receiving equipment 401 or a set top box 407 so as to reproduce the decoded data. Furthermore, it is possible to implement the decoding methods presented in the above embodiments in a reproducing apparatus 403 that reads and decodes a coded bit stream recorded in a storage medium 402 which is a recording medium. In this case, a reproduced video signal is displayed on a monitor 404. Another possible configuration is that a decoding apparatus is implemented inside the set top box 407 which is connected to a cable 405 for cable televisions or to the antenna 406 for satellite/terrestrial broadcasting and the reproduced video signal is displayed on a television monitor 408. In such a case, a decoding apparatus may be incorporated not into the set top box but into the television. Moreover, it is also possible for a car 412 having an antenna 411 to receive a signal from the satellite 410 or from the base station 107 and the like, and to display a moving picture on such a displaying device of the car 412 as a car navigation system 413 and the like.

A possible configuration of the car navigation system 413 is the configuration illustrated in FIG. 18 from which the camera unit 203 and the camera controlling unit 303, for example, are excluded. The same is also applicable to the computer 111, the television receiving equipment 401 and others. Concerning terminals such as the mobile phone 114, a transmitting/receiving terminal having both a coder and a decoder, as well as a transmitting terminal only with a coder and a receiving terminal only with a decoder are possible as forms of implementation.

As stated above, by implementing the coding methods and the decoding methods described above, it is possible to embody the present invention as any one of the apparatuses and the system presented in the aforementioned embodiments.

INDUSTRIAL APPLICABILITY

As described above, it is possible for the picture coding methods and the picture decoding methods according to the present invention to realize coding processing and decoding processing through which data compression equivalent to conventional one and to reduce processing load to be generated at the time of selecting code tables, and others. Therefore, the picture coding methods and the picture decoding methods according to the present invention are suited as picture coding methods and picture decoding methods for mobile phones, mobile information terminals and others that do not have sufficient processing capability and storage capacity.

The invention claimed is:

1. A decoding device that decodes a moving picture on a block basis, said decoding device comprising:
   a demultiplexer configured to receive a picture coded signal and to demultiplex the picture coded signal into a header stream and a frame stream;
   a header information decoding unit configured to receive the header stream and to perform non-arithmetic decoding on the header stream selectively with either a fixed length code or a variable length code according to a syntax structure signal so as to generate a header code value signal;
   a header information generating unit configured to receive the header code value signal and to generate a header parameter corresponding to the header code value signal, the header parameter and the header code value signal being common to a plurality of blocks of moving picture signals;
   an arithmetic decoding unit configured to perform only arithmetic decoding on the frame stream so as to construct a frame code value signal; and
   a frame decoding unit configured to decode, on the block basis, the frame code value signal with reference to the header parameter so as to output a decoded moving picture signal,
   wherein the header information decoding unit includes:
      a fixed length decoding unit for fixed length decoding a plurality of header code value signals according to at least one of a plurality of fixed length decoding methods;
      a variable length decoding unit for variable length decoding the plurality of header code value signals according to at least one of a plurality of variable length decoding methods; and
      a decoding selecting unit configured to select one of the fixed length decoding unit or the variable length decoding unit according to the syntax structure signal, and
   wherein the header information decoding unit is configured to decode the header code value signal corresponding to the fixed length code, using one of the plurality of fixed length decoding methods according to the syntax structure signal, when the fixed length decoding unit is selected by the decoding selecting unit, and the header information decoding unit is configured to decode the header code value signal corresponding to the variable length code, using one of the plurality of variable length decoding methods according to the syntax structure signal, when the variable length decoding unit is selected by the decoding selecting unit.

* * * * *